(12) United States Patent
Cairns et al.

(10) Patent No.: US 6,215,346 B1
(45) Date of Patent: Apr. 10, 2001

(54) CLOCK PULSE GENERATOR, SPATIAL LIGHT MODULATOR AND DISPLAY

(75) Inventors: Graham A. Cairns, Cutteslowe; Michael J. Brownlow, Sandford on Thames, both of (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/426,737

(22) Filed: Oct. 26, 1999

(30) Foreign Application Priority Data

Oct. 27, 1998 (GB) .................................... 9823368

(51) Int. Cl.[7] ........................................ G06F 1/04
(52) U.S. Cl. ........................ 327/296; 327/293; 327/259
(58) Field of Search .................... 327/291, 295, 327/296, 297, 172, 175, 299, 258, 259; 326/93, 95, 96, 97, 98

(56) References Cited

U.S. PATENT DOCUMENTS

| 4,295,055 | 10/1981 | Takemoto et al. | 377/76 |
| 4,542,301 | * 9/1985 | Narabu | 327/160 |
| 4,746,915 | * 5/1988 | Sekiya | 340/719 |
| 5,136,622 | * 8/1992 | Plus | 377/64 |
| 5,335,254 | * 8/1994 | Tu et al. | 377/76 |
| 5,434,899 | * 7/1995 | Huq et al. | 377/78 |
| 5,517,543 | 5/1996 | Schleupen et al. | 377/79 |
| 5,648,790 | 7/1997 | Lee | 345/58 |
| 5,859,630 | * 1/1999 | Huq | 345/100 |

FOREIGN PATENT DOCUMENTS

| 0293156 | 5/1988 | (EP) . |
| 0315362 | 10/1988 | (EP) . |
| 9826423 | 6/1998 | (WO) . |

* cited by examiner

*Primary Examiner*—Timothy P. Callahan
*Assistant Examiner*—Hai L. Nguyen
(74) *Attorney, Agent, or Firm*—Renner Otto Boisselle & Sklar LLP

(57) ABSTRACT

A clock pulse generator comprises N stages 1, 2, where N is greater than 3. Each ith stage comprises a transmission gate M3, M4; M9, M10 which is controlled by a control signal from the (i−1)th stage for passing a clock pulse from the clock input CK to the output Nn, Pp of the stage. A control signal generating circuits M5, M6; M11, M12 supplies a control signal to the (i+1)th stage and is inhibited from supplying further control signals in response to a control signal from the (i+2)th stage, where 1<i<(N−1).

40 Claims, 23 Drawing Sheets

CLOCK PULSE GENERATOR, SPATIAL LIGHT MODULATOR AND DISPLAY

BACKGROUND OF THE INVENTION

1. Field of the Invention

The present invention relates to a clock pulse generator. Such a generator may be used in high speed low power controller circuits, for instance in complex very large scale integrated (VLSI) designs including digital signal processing (DSP). The clock pulse generator may advantageously be used in addressing for driver circuits of spatial light modulators and displays, for example of the pixelated matrix type in which a sequence of well-defined pulses must be supplied to circuits which sample high speed video data.

2. Description of the Related Art

A known type of clock pulse generator is based on a shift register. The shift register comprises a cascaded chain of D-type flip-flops which respond to clock pulses to pass a single stored logic state from one flip-flop to the next in the chain. For a typical clock pulse generation application, all but one of the states of the flip-flops are initialised to a logic low (0) state whereas the remaining flip-flop is initialised to a logic high (1) state. The shift register is clocked at a known frequency and the circulating one state within the shift register is used to generate sequential pulses at the outputs of the flip-flops. This well-known technique is disclosed, for example, in U.S. Pat. No. 4,542,301 and U.S. Pat. No. 4,612,659. An improvement to this technique is disclosed in U.S. Pat. No. 4,785,297. In this case, the "master" and "slave" outputs of each of the flip-flops are used in conjunction with combinational logic gates, such as AND or NAND gates, to reduce the clocking speed of the shift register for a given number of output pulses.

It is also well-known to form clock pulse generating circuits from chained D-type latch circuits. FIG. 1 of the accompanying drawings illustrates part of a typical CMOS circuit comprising latches 1 and 2. The construction and operation of such an arrangement is well-known and will not be described in detail. Consecutive latches such as 1 and 2 are transparent on opposite clock phases of a two phase clock represented by CK and CK–. The input and output of each latch are "NANDed" together in order to produce the clock pulses Nn and Np as illustrated in FIG. 2 of the accompanying drawings. FIG. 2 also illustrates the two phase clock waveforms, the D input to the first latch 1, the output M of the first latch 1 which is also the input of the second latch 2, and the output Q of the second latch 2.

This arrangement has several disadvantages. In particular, a two phase clock is required to drive the shift register. Also, each clock line drives two transistor gates in each of the latches 1,2. This presents a relatively high capacitive loading to each clock phase and limits the maximum frequency of operation. Further, the output pulses Nn and Np cannot be guaranteed to be non-overlapping. This can cause problems in certain applications, for example when the output pulses are used for sampling video data in pixel matrix display drivers.

Various techniques have been disclosed for reducing the capacitive loading of the clock line or lines so as to increase the maximum frequency of operation and reduce clock power consumption. For example, state-controlled clocking techniques have been suggested for use in clock pulse generating circuits. An example of this is disclosed in U.S. Pat. No. 4,746,915, in which the shift register is divided into several sub-registers of flip-flops or latches and another shift register operating at a lower frequency is used selectively to apply the clock signal to each sub-register.

For applications in which the requirement is for a single circulating 1 state, only those flip-flops or latches containing a 1 state or having a 1 state at their input require clocking. As shown in FIG. 3, for such applications, the signal generated by "ORing" the input and output of each flip-flop can be used to gate the clock signals supplied to the clock input of the flip-flop. Such an arrangement is disclosed in T. Maekawa et al, "A 1.35-in.-diagonal wide-aspect-ratio poly-Si TFT LCD with 513 k pixels" Journal of the Society or Information Display, pp 415–417, 1994. However, such an arrangement requires a full flip-flop and several further transistors per stage. Also, the flip-flop outputs have to drive a relatively large load and this limits the maximum speed of operation.

SUMMARY OF THE INVENTION

The term "pass gate" as used herein is defined to mean a semiconductor arrangement having a main conduction path which can be controlled to transmit or block the passage of an input signal.

According to a first aspect of the invention, there is provided a clock pulse generator comprising a clock input and N stages where N is greater than three, each ith one of the stages comprising a pass gate arranged to be controlled by a control signal from the (i–1)th stage for passing a clock pulse from the clock input to an output of the pass gate and a control signal generating circuit responsive to the output of the pass gate for supplying a control signal to the (i+1)th stage, the control signal generating circuit being arranged to be inhibited from supplying further control signals in response to a control signal from the (i+2)th stage, where $1 < i < (N-1)$.

The control signal generating circuit of each ith stage may comprise first and second metal-oxide-silicon field effect transistors of opposite conductivity types connected in series between first and second power supply inputs, the gate of the first transistor being connected to the output of the pass gate and the gate of the second transistor being connected to the control signal generating circuit of the (1+2)th stage.

Each ith stage may comprise a switching arrangement for selectively causing the pass gate to be controlled by control signal from the (i+1)th stage and the control signal generating circuit to be inhibited in response to a control signal from the (i–2)th stage. The switching arrangement may comprise a plurality of further pass gates connected to the output of the control signal generating circuit and having control inputs for receiving direction control signals.

At least one of the pass gate outputs may constitute outputs of the generator.

At least one of the control signals or the complements thereof may constitute output signals of the generator.

The pass gates may have inputs connected to the clock input.

Each ith stage may comprise an inverter having an input connected to receive the control signal for the pass gate and an output connected to the pass gate.

Each of the pass gates may be a transmission gate comprising third and fourth metal-oxide-silicon field effect transistors of opposite conductivity types whose source-drain paths are connected in antiparallel. The gate of the fourth transistor may be connected to the output of the inverter and the gate of the third transistor may be connected to the input of the inverter.

The pass gate of each ith stage may comprise a fifth metal-oxide-silicon field effect transistor of the same conductivity type as the first transistor.

The clock input may be a single phase clock input. The clock pulses passed by the pass gates of consecutive stages may be of opposite polarity. The third transistors of the transmission gates of consecutive stages may be of opposite conductivity types. The first transistors of consecutive stages may be of opposite conductivity types.

The clock input may be a two-phase clock input. The pass gate inputs of consecutive stages may be connected to different clock input phases. The clock pulses passed by the pass gates of the stages may be of the same polarity. The third transistors of the stages may be of the same conductivity type. The first transistors of the stages may be of the same conductivity type.

The pass gate output of each sage may be provided with a pull-up or pull-down transistor. Each of the pull-up or pull-down transistors may have a control electrode connected to the input or output of the inverter.

Each of the stages may have a control signal input for receiving the control signal for the pass gate, each control signal input being provided with a pull-up or pull-down arrangement. Each of the pull-up or pull-down arrangements may comprise a transistor arrangement having a first control electrode connected to the output of the inverter and a second control electrode connected to the control input of the preceding stage or the output of the inverter of the preceding stage.

Each of the stages may have a resetting circuit for resetting the stage in response to a reset signal. Each of the stages may have a control signal input for receiving the control signal for the pass gate, the resetting circuits of consecutive stages being arranged to reset the logic states of the signal at the control signal inputs to opposite states. Each of the resetting circuits may comprise a sixth transistor. The sixth transistors of consecutive stages may be of opposite conductivity types and may have control electrodes connected to reset inputs of opposite polarity. The sixth transistors may be of the same conductivity type and may have control electrodes connected to a common reset input.

Each of the stages may have a control signal input for receiving the control signal for the pass gate, the resetting circuits being arranged to reset the logic states of the signals at the control signal inputs of the stages to the same state. Each of the resetting circuits may comprise a sixth transistor. The sixth transistors may be of the same conductivity type and may have control inputs connected to a common reset input.

The generator may comprise a CMOS integrated circuit.

According to a second aspect of the invention, there is provided a spatial light modulator comprising a clock pulse generator according to the first aspect of the invention.

The modulator may comprise a liquid crystal device.

According to a third aspect of the invention, there is provided a display comprising a modulator according to the second aspect of the invention.

It is thus possible to provide a clock pulse generator having a very high maximum frequency of operation. In particular, it is possible to provide a generator in which the clock pulses are required to charge only on transistor gate at a time (in addition to any external load when the pass gate outputs constitute the outputs of the generator). Also, the cock signal can be fully gated. This is important for two reasons. Firstly, transistor loading of the clock signal limits its rise and full times and hence the maximum frequency. With the present arrangement, loading of the clock is mainly due to parasitic elements so that high speed can be maintained for relatively large clock pulse generators.

Secondly, the capacitive loading of the clock signal by transistor gates can be minimised. In particular, apart from charging only one gate per stage, only the gates of transistors in stages which are in their switching state are charged. This results in reduced power consumption and, in particular, in lower power dissipation in the track resistance of circuit tracks carrying the clock signal.

The output pulses may be exact copies of the clock signal (degraded only by passage through the pass gates). The pass gates may be made relatively large so that the drive capability is high. The output pulses when taken from the pass gates are guaranteed to be non-overlapping. The clock pulse generator may be arranged for dynamic operation, partially static operation or pseudo-static operation. Although the highest operating speed is attained with dynamic operation, partially static or pseudo-static operation may be more practical for larger circuits.

Although some embodiments require a two phase clock, others require only a single phase clock.

A variety of useful signals may be generated from each pair of consecutive stages and these include:

(i) Independent non-overlapped (positive or negative) pulses of duration substantially equal to the clock pulse high period and synchronized with the clock rising edge;

(ii) Independent non-overlapping (positive or negative) pulses of duration substantially equal to the clock low period and synchronised to the clock falling edge;

(iii) Independent overlapping positive and negative pulses of duration substantially equal to the clock period and synchronised to the clock rising edge;

(iv) Independent overlapping positive and negative pulses of duration substantially equal to the clock period and synchronised to the clock falling edge.

In the case of the non-overlapping pulses, the relative pulse widths may be changed merely by changing the mark-to-space ratio of the clock signal used to drive the clock pulse generator.

In some embodiments, voltage level shifting can be provided. In particular, the clock signal may be of lower voltage than the generator supply voltage so that a reduction in power consumption can be achieved. Also, in some embodiments, the generator can operate selectively in either direction ("forward" or "reverse"). This is advantageous in some applications, such as display driving in which the displayed image may need to be spatially inverted.

BRIEF DESCRIPTION OF THE DRAWINGS

The invention will be further described, by way of example, with reference to the accompanying drawings, in which.

Like reference numerals refer to light parts throughout the drawings.

DESCRIPTION OF THE PREFERRED EMBODIMENTS

In the following description, four types of pulses (each of half the clock pulse period) are identified as follows:

Pp: positive pulses coinciding with positive-going pulses of clock signal CK;

Pn: positive pulses coinciding with negative-going pulses of clock signal CK;

Np: negative pulses coinciding with positive-going pulses of clock signal CK;

Nn: negative pulses coinciding with negative-going pulses of clock signal CK.

Figure 1:
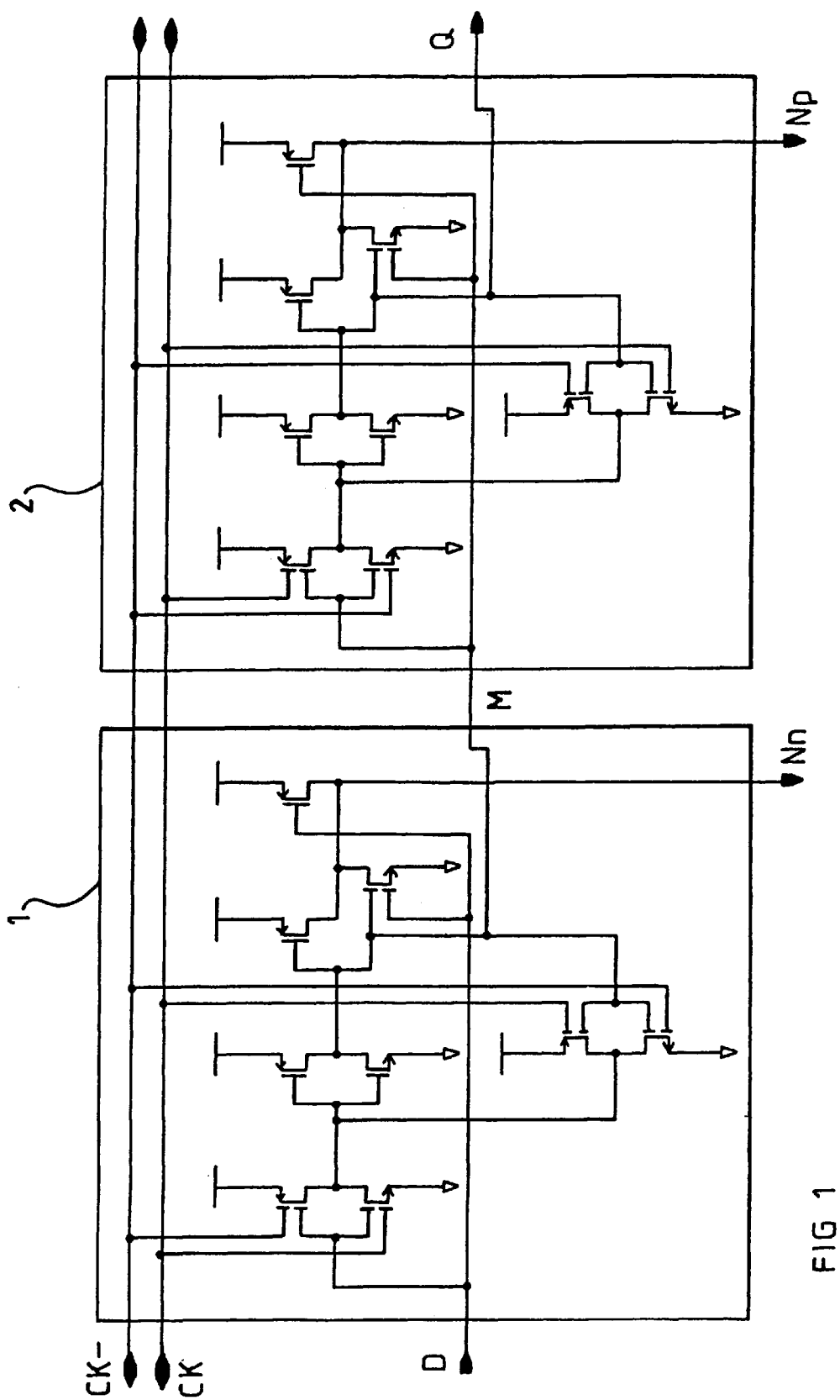
FIG. 1 is a circuit diagram of two stages of a known type of shift register.
Figure 2:
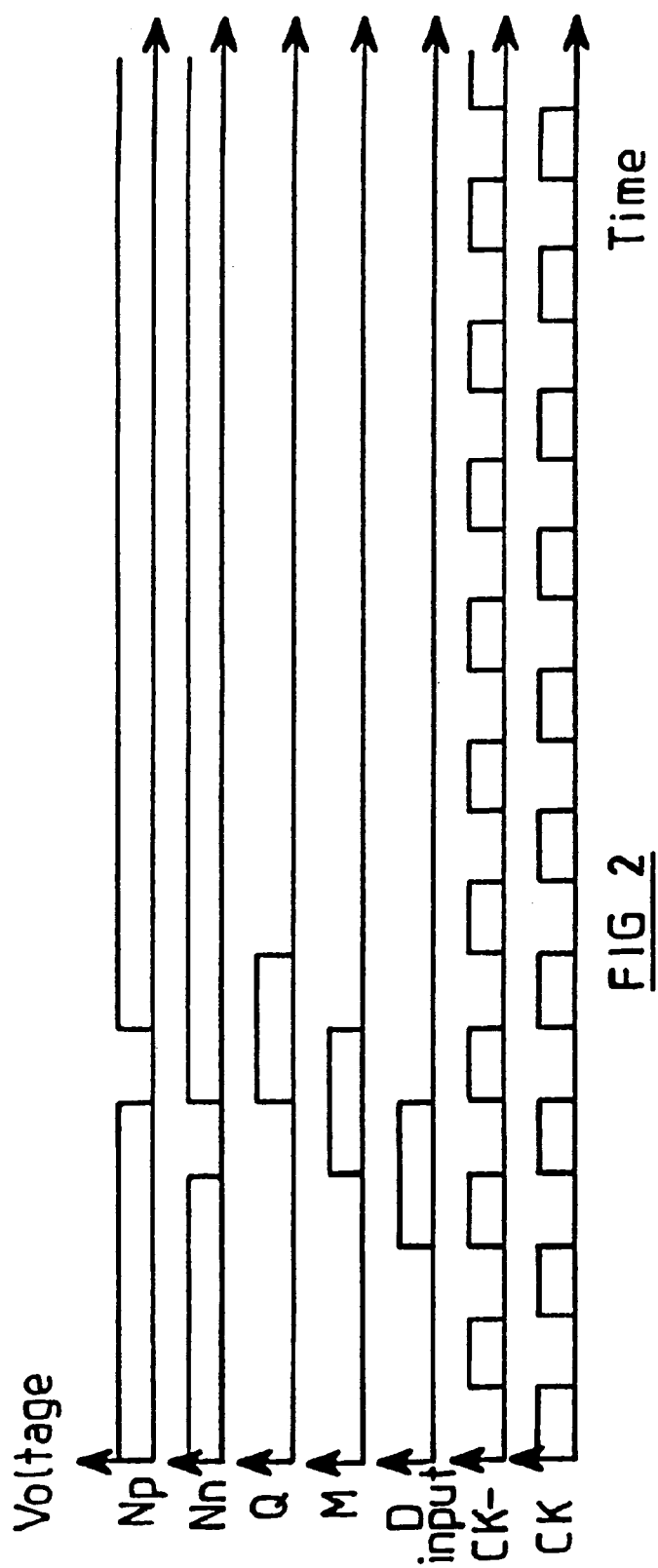
FIG. 2 is a diagram illustrating waveforms occurring in the stages shown in FIG. 1.
Figure 3:
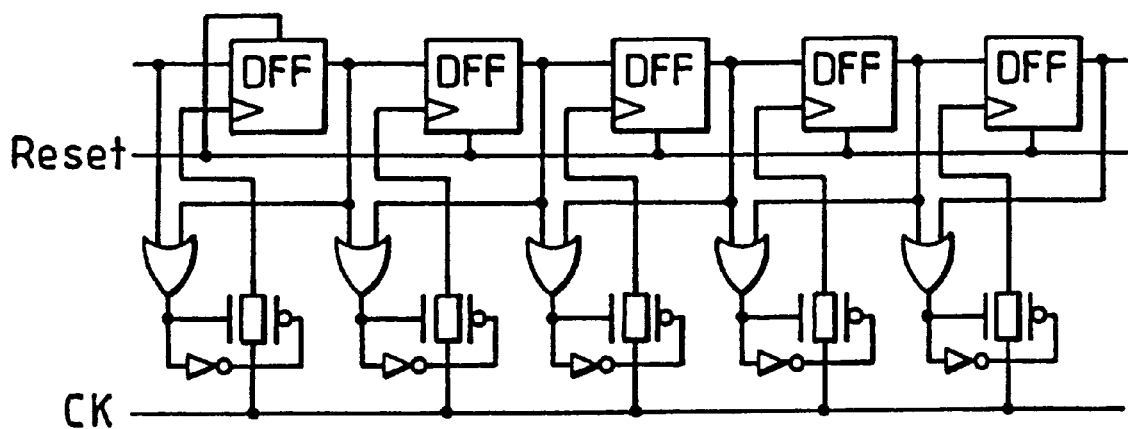
FIG. 3 is a block circuit diagram of a known type of clock pulse generator.
Figure 4:
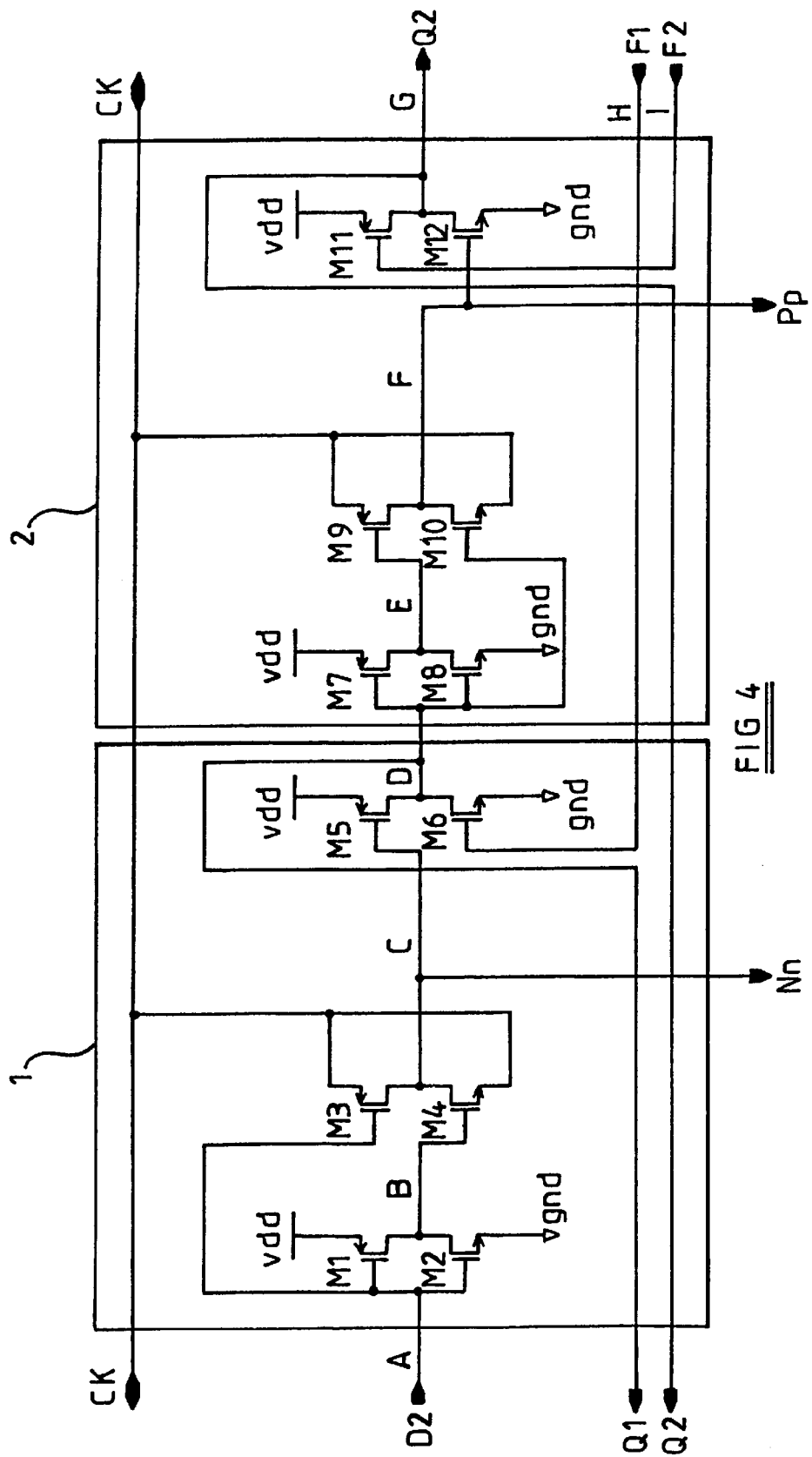
FIG. 4 is a circuit diagram of two stages of a dynamic clock pulses generator constituting an embodiment of the invention.

The clock pulse generator stages 1 and 2 shown in FIG. 4 operate in a complementary fashion to transmit negative and positive clock pulses Nn and Pp respectively of a single phase clock signal CK. The stage 1 comprises P-type transistors M1, M3 and M5 and N-type transistors M2, M4 and M6. The generator is embodied as or as part of a CMOS large scale integrated circuit.

The stage 1 has a control signal input D2 which receives control signals A from the preceding stage. The input D2 is connected to the gates of the transistors M1 and M2, which are connected in series between supply lines vdd and gnd to form an inverter. The transistors M3 and M4 have their source-drain paths connected in antiparallel to form a transmission gate. The gate of the transistor M3 receives the control signal A whereas the gate of the transistor M4 receives the output signal B from the inverter. The input of the transmission gate is connected to a clock line for receiving the clock signals CK from an external signal phase clock (not shown). The output of the transmission gate supplies signals C to a control signal generating circuit comprising the transistors M5 and M6. The signals C are also supplied as output signals Nn of the stage 1.

The transistors M5 and M6 are connected in series between the supply liens vdd and gnd. The gate of the transistor M6 receives signals H from an input F1 which are supplied from the output of the control signal generating circuit of the stage which follows the stage 2 shown in FIG. 4 and which is identical to the stage 1. The output signals D of the control signal generating circuit are supplied as input to the stage 2 and as the signal H via the output Q1 to the stage before the stage connected to the input D2 of the stage 1 shown in FIG. 4.

The stage 2 comprises an inverter formed by the transistors M7 and M8, a transmission gate formed by the transistors M9 and M10 and a control signal generating circuit formed by the transistors M11 and M12. The stage 2 is thus identical in structure to the stage 1 but, as described hereinafter, operates in a complementary fashion with respect to the polarity of the clock pulses CK. Waveforms E to I and output Pp are produced by the stage 2 and will be described hereinafter.

Figure 5:
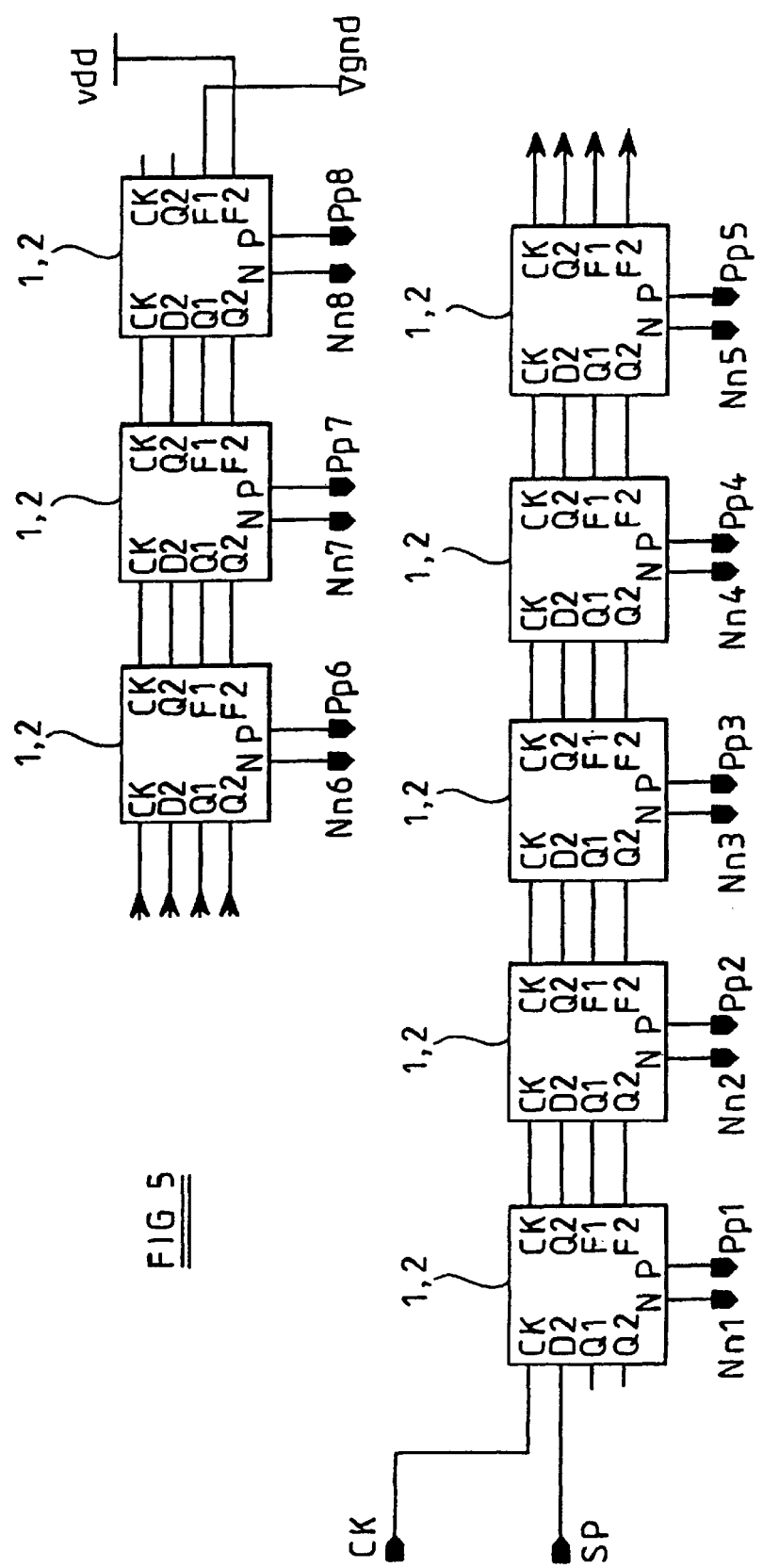
FIG. 5 is a block diagram of the clock pulse generator whose stages are illustrated in FIG. 4.

FIG. 5 illustrates how pairs of stages 1 and 2 are connected together so as to form the complete clock pulse generator. The generator comprises eight such pairs of stages connected in cascade. The interconnections between consecutive pairs of stages are illustrated using the same reference numerals as in FIG. 4. The outputs Nn and Pp are given subscripts representing the position of the stages in the clock pulse generator. A start pulse SP is supplied to the input D2 of the first stage 1 whereas the output Q2 of the last stage 2 is unconnected. The F1 and F2 of the laste stage 2 are connected to the supply lines gnd and vdd, respectively.

Figure 6:
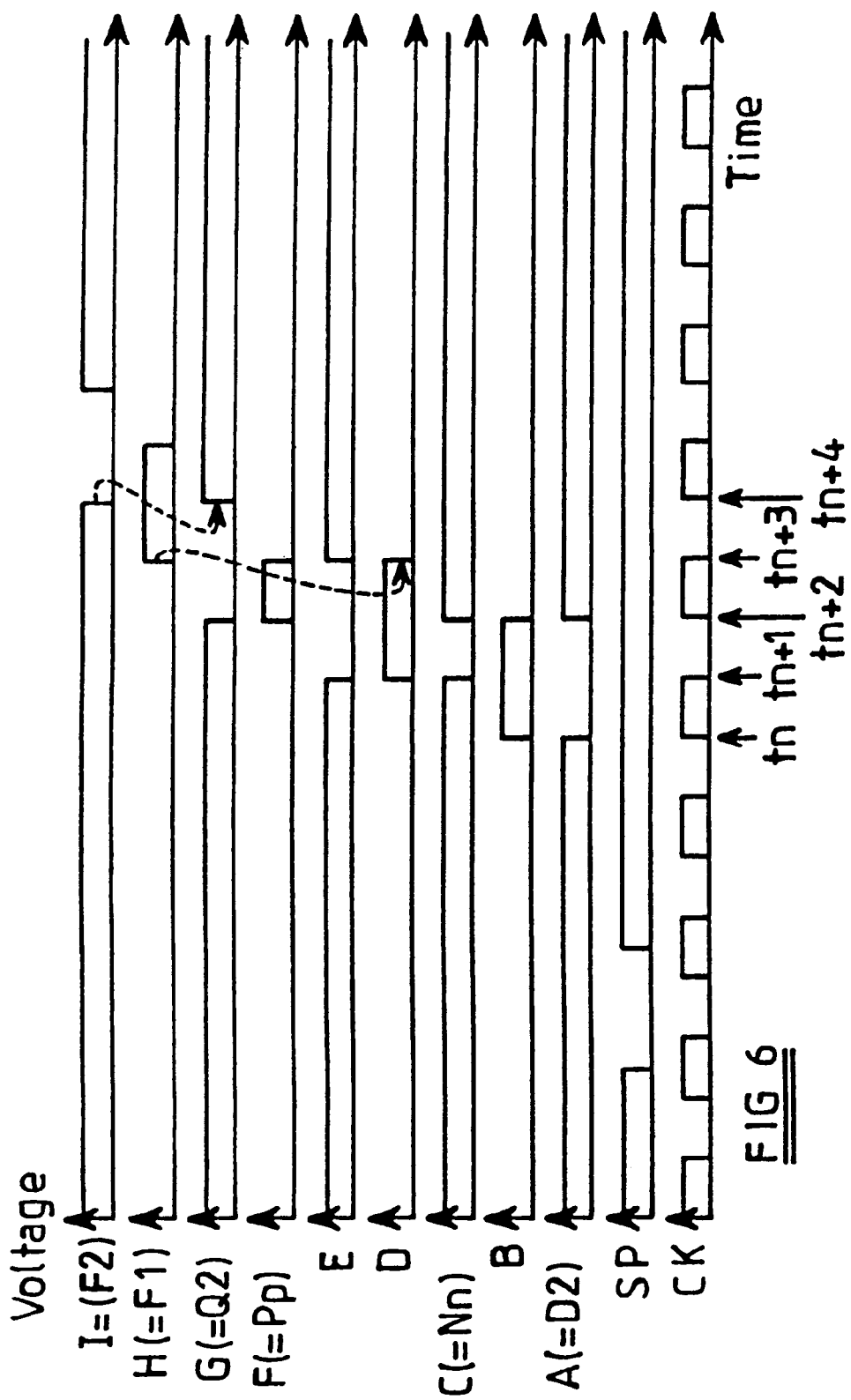
FIG. 6 is a diagram illustrating waveforms occurring in the clock pulse generator shown in FIGS. 4 and 5.

FIG. 6 illustrates the start pulse SP and the clock pulses CK together with the various waveforms occurring in the fourth pair of stages 1 and 2. The initial conditions of the fourth pair of stages are such that the signals A, C, E, G and I are high whereas the signals B, D, F and H are low.

At time tn, the signal A supplied by the preceding stage goes low so that the output B of the inverter formed by the transistors M1 and M2 goes high. The transmission gate formed by the transistors M3 and M4 is turned on so that the positive clock pulse is passed by the transmission gate as the pulse C and the output Nn of the stage 1. The signal C remains high until time tn+1.

At time tn+1, the clock signal CK goes low so that the signal C follows and the transistor M5 causes D to go high. The signal E goes low and the transmission gate formed by the transistors M9 and M10 is turned on to pass the clock signal to F. The clock signal is low between times tn+1 and tn+2 so that the signals F remains low until the time tn+2.

At the time tn+2, the clock signal goes high and the signals C and F follow. The transistor M12 causes the signal G to go low and the signal is fed back via the output Q2 to the preceding stage 2, where it turns on the transistor M11 of that stage so that the control signal A supplied to the stage 1 goes high. The transmission gate formed by the transistors M3 and M4 is therefore turned off with the signal C held high.

At time tn+3, the clock signal goes low and the signal F follows. The feedback signal H from the following stage 1 supplied via the input F1 switches on the transistor M6 so that the signal D goes low. The signal E goes high so that the transmission gate formed by the transistors M9 and M10 is turned off with the signal F held low.

At time tn+4, the feedback signal I generated in the following stage 2 and supplied via the input F2 goes low. The transistor M11 is turned on so that the signal G goes high and switches off the gate signal in the following stage 1.

Figure 7:
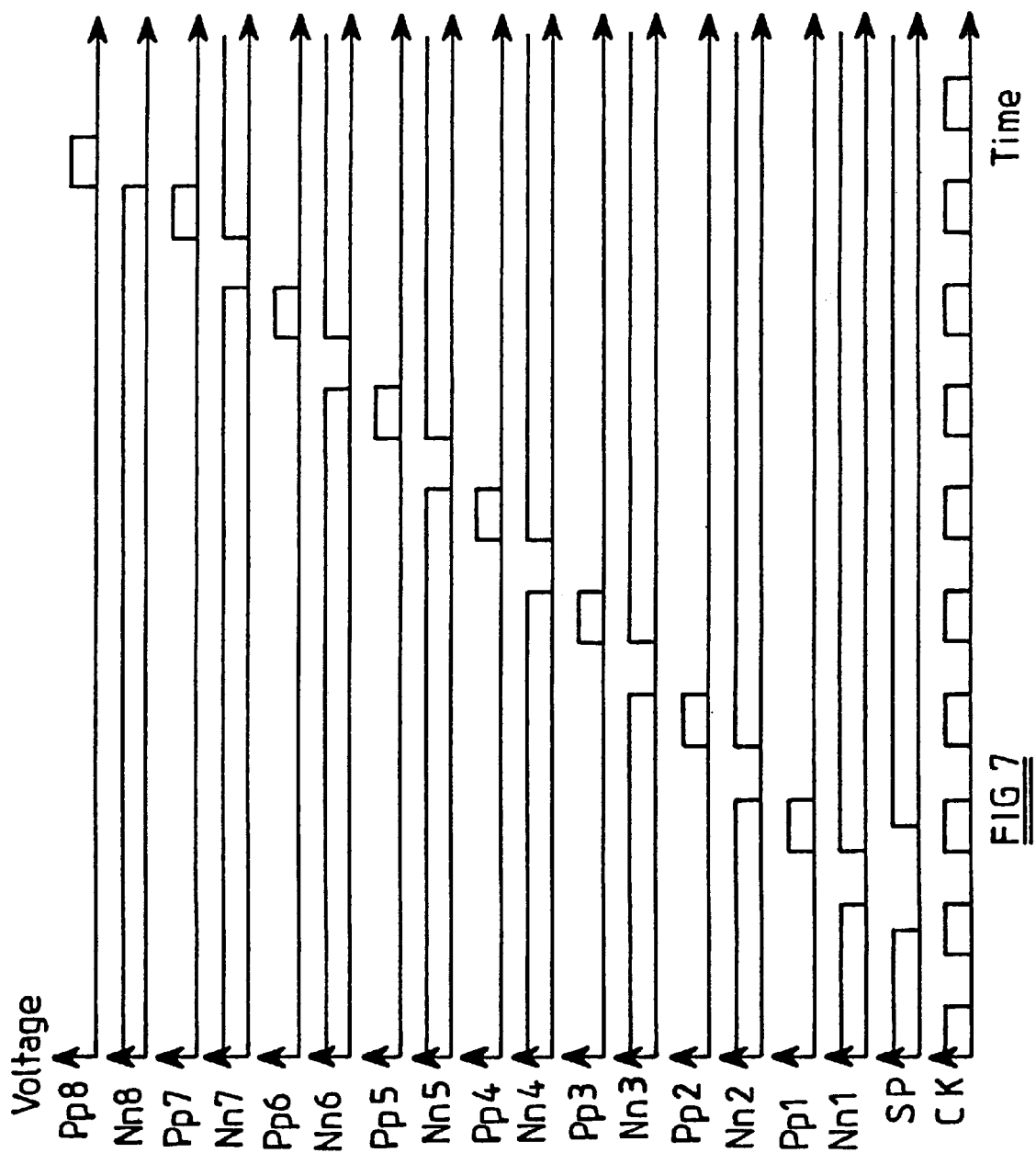
FIG. 7 is a diagram illustrating waveforms occurring in the clock pulse generator of FIG. 5.

FIG. 7 illustrates the complete set of Nn and Pp outputs of the clock pulse generator of FIG. 5 together with the start pulse SP and the clock signal CK. The Nn signals are successive non-overlapping negative going pulses copied from the clock signal "low state" and delayed by a single transmission gate. The Pp signals are successive non-overlapping positive pulses copied from the clock signal "high state" and delayed by a single transmission gate. The signal Nn8 does not return to the high state after the transition from the high state to the low state because the signal is generated by the last pair of stages in the circuit chain and these do not receive the correct feedback signals F1 and F2. However, if it is required that the signal Nn8 does return to the high state, an extra pair of stages 1 and 2 may be added to the end of the chain simply for supplying the correct feedback signals.

Figure 8:
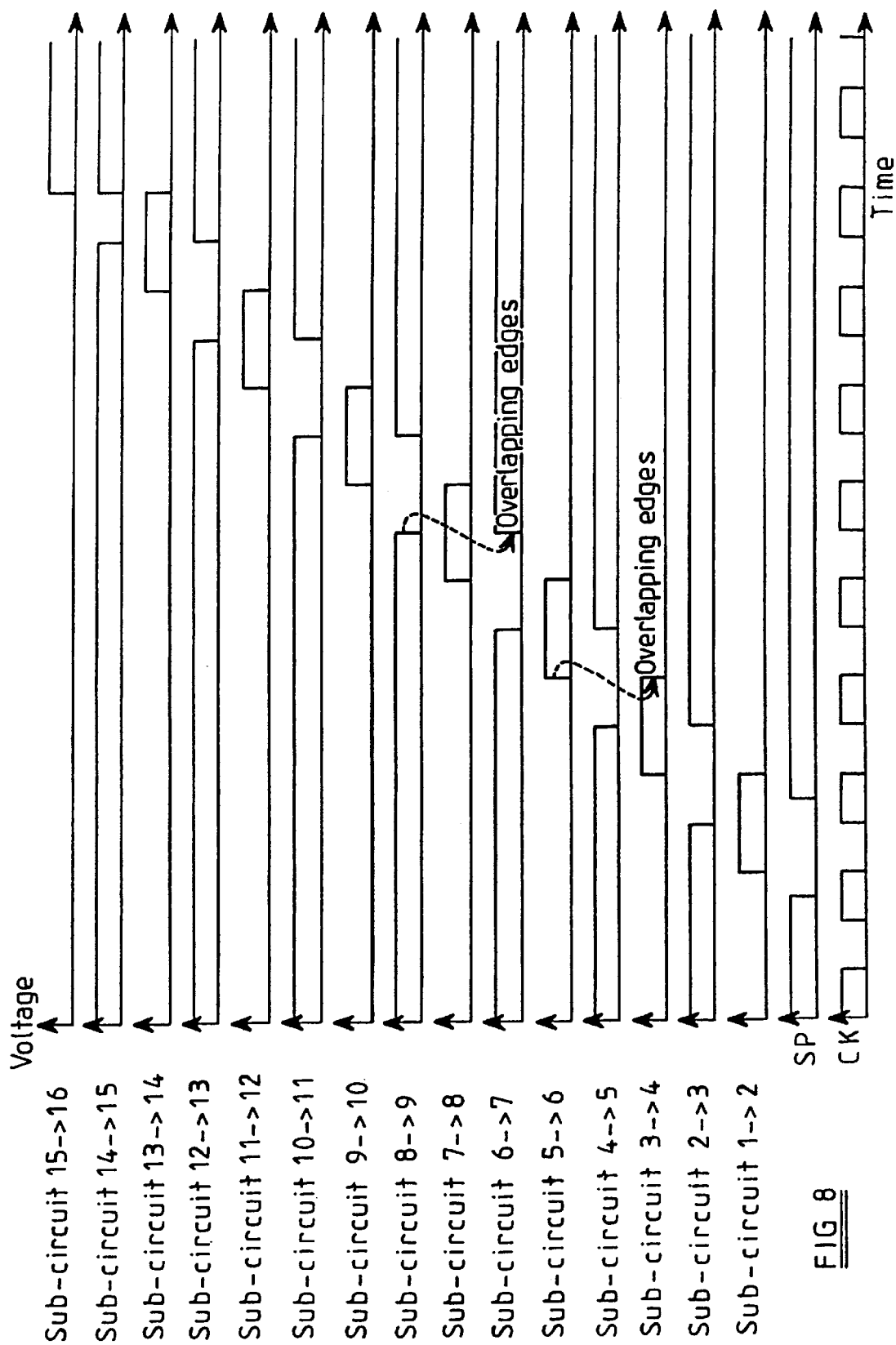
FIG. 8 is a diagram illustrating further waveforms occurring in the clock pulse generator of FIG. 5.

In addition to the gated clock pulses Nn and Pp, the control signals D and G maybe supplied as outputs from the clock pulse generator. These signals are illustrated in FIG. 8 and their complements may also be made available as the outputs of the inverters in each of the stages. These signals overlap each other so that longer or shorter duration pulses may be generated using combination logic.

The initial conditions of several of the nodes in the stages shown in FIG. 4 have to be forced in order for the circuit to work correctly. This may be achieved by scaling the relative sizes of the transistors so as to force the quiescent balance points of the N-type and P-type drain connections. Alternatively, resetting devices may be provided as described hereinafter. However, because of the dynamic circuit operation of this embodiment, the nodes are susceptible to drifting as a result of transistor current leakage and capacitive injection. This may result in unclean signals with reduced noise margins. To prevent this occurring, partially static or pseudo-static operation as described hereinafter may be adopted.

Figure 9:
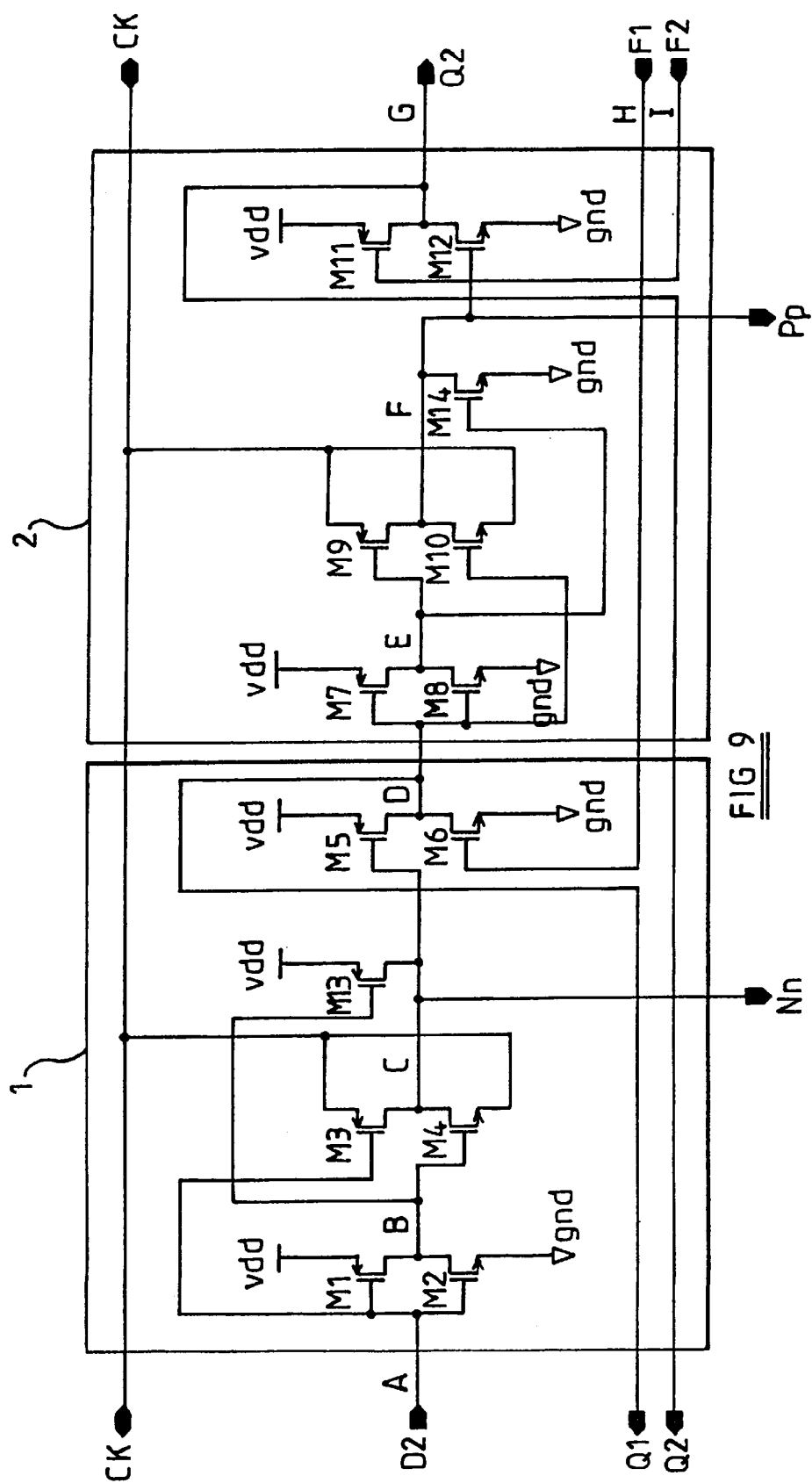
FIG. 9 is a circuit diagram of two stages of a partially static clock pulse generator constituting an embodiment of the invention.

The clock pulse generator stages 1 and 2 shown in FIG. 9 differ from those shown in FIG. 4 in that they are partially static. In particular, transistors M13 and M14 are provided as pull-up P-type and pull-down N-type transistors, respectively. The transistor M13 is connected between the supply line vdd and the output of the transmission gate with its gate connected to the output of the inverter of the stage 1. The transistor M14 is connected between the output of the transmission gate and the supply line gnd with its gate connected to the output of the inverter of the stage 2. The transistor M13 ensures that the output signal Nn is pulled high when the control input signal is off whereas the transistor M14 ensures that the output signal Pp is pulled low when the gate control signal to the stage 2 is off. Thus, the output signals Nn and Pp are either fixed to their correct default value or follow the clock signal. The waveforms occurring in the stages 1 and 2 are as shown in FIGS. 6, 7 and 8.

Figure 10:
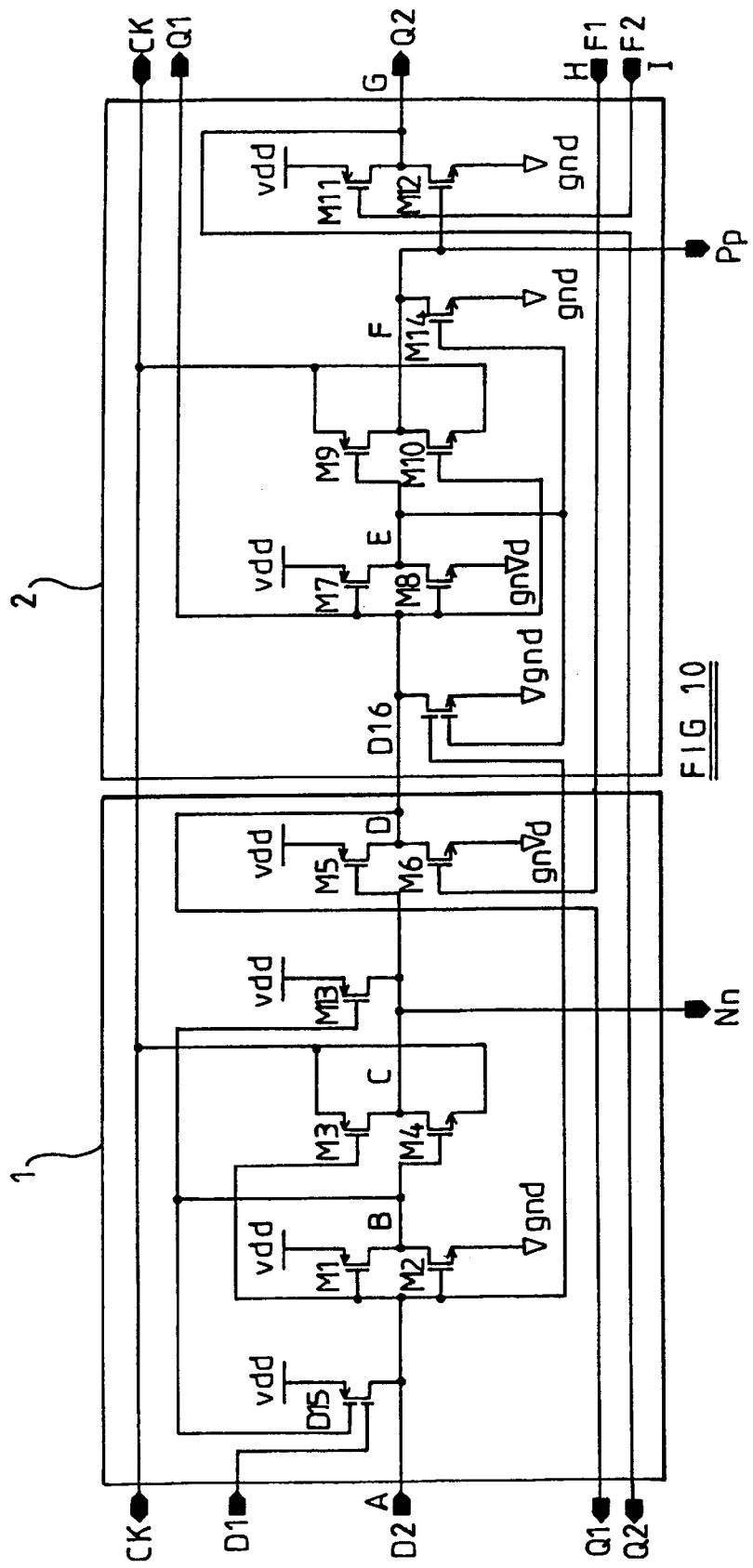
FIG. 10 is a circuit diagram of two stages of a pseudo-static clock pulse generator constituting an embodiment of the invention.

The clock pulse generator stages 1 and 2 shown in FIG. 10 are pseudo-static and differ from those shown in FIG. 9 in that dual gate transistors D15 and D16 are provided. Alternatively, each of these dual gate transistors maybe replaced by two discrete single gate transistors. The transistor D15 is connected between the input and the supply line vdd of the stage 1 whereas the transistor D16 is connected between the input and the supply line gnd of the stage 2. The gates of the transistor D15 are connected to receive the control signal D1 of the stage 1 preceding those shown in FIG. 10 and to receive the output B of the inverter of the stage 1. Similarly, the gates of the transistor D16 are connected to receive the control signal A of the stage 1 shown in FIG. 10 and the output signal E of the inverter of the stage 2.

The default state of the inverter comprising the transistors M1 and M2 is with the input signal A high and the output signal B low. The signal B is fed back to one of the gates of the transistor D15 so as to turn that gate on. The signal at D1 is also in the low or default state so that both gates of the transistor D15 are turned on. The inverter comprising the transistors M1 and M2 is thus locked in the high input/low output state. When the preceding stage 2 becomes active, the signal at input D1 goes high and switches off one of the gates of the transistor D15. One half a clock period later when the signal A changes state, the inverter comprising the transistors M1 and M2 is unlocked and remains unlocked until the output signal B of the inverter changes back to its default or low state. The lock is therefore open for one and a half clock periods.

The transistor D16 provides the same latching operation but operates in the opposite logic sense. The lock is only opened when necessary i.e. when the preceding stage 1 of the pair of stages receives its clock gate control signal. The lock remains open until the output signal E changes back to its default high state.

As described hereinbefore, all of the circuit nodes are actively switched (i.e. are static) when the stages are in their default states. However, when the stages are activated, the nodes A and D of the stages 1 and the nodes D and G of the stages 2 are momentarily floating and hence are momentarily dynamic. Accordingly, the terminology "pseudo-static" has been adopted to describe these stages.

Figure 11:
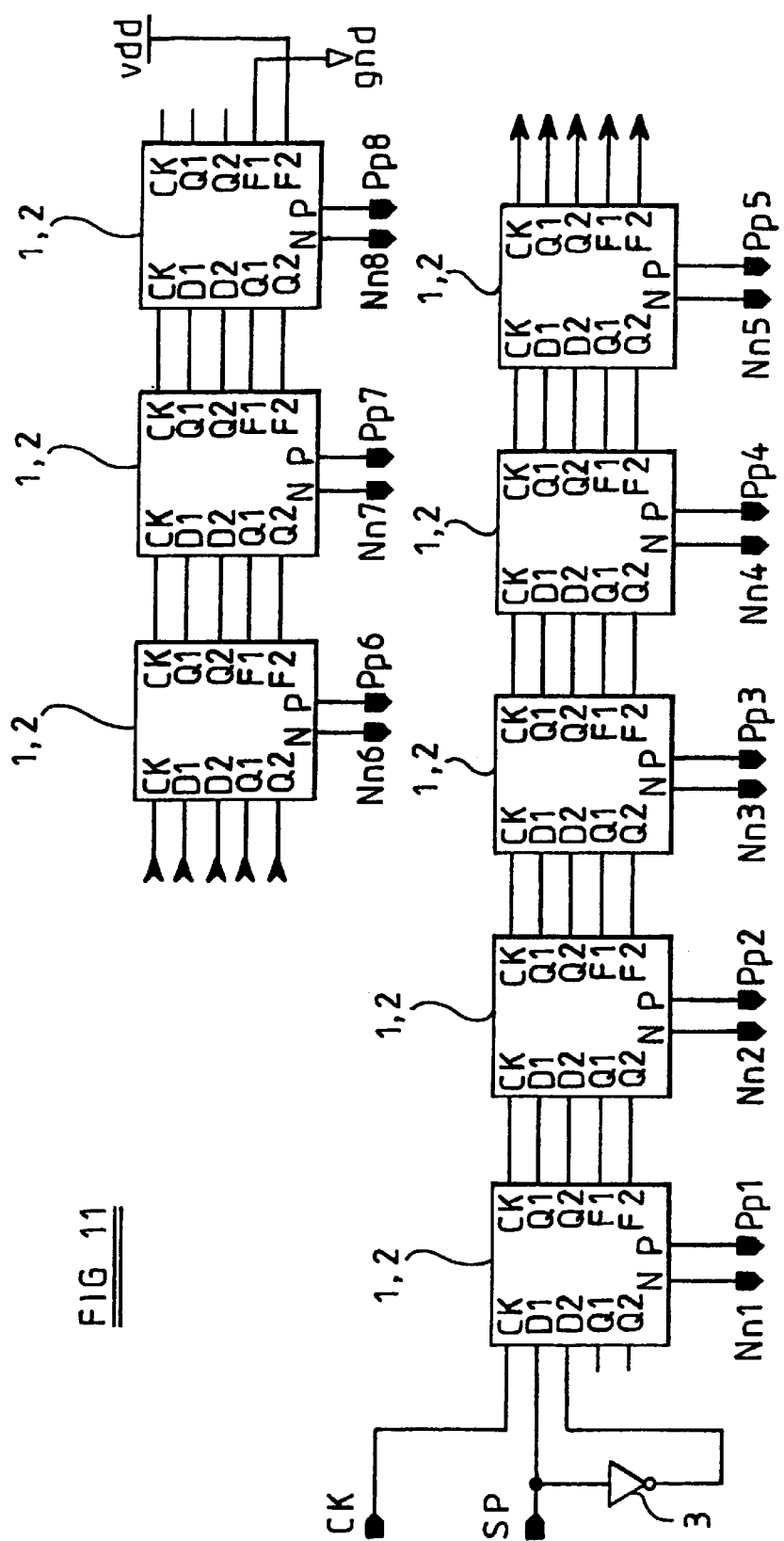
FIG. 11 is a block circuit diagram of the clock pulse generator whose stages are illustrated in FIG. 10.

FIG. 11 illustrates eight pairs of stages of the type shown in FIG. 10 connected in cascade to form a clock pulse generator. In order for correct operation, the input D2 of the first stage 1 receives the inverse of the start pulse SP via an inverter 3. Again, the signals present during operation of the clock pulse generator illustrated in FIGS. 10 and 11 are as shown in FIGS. 6, 7 and 8.

Figure 12:
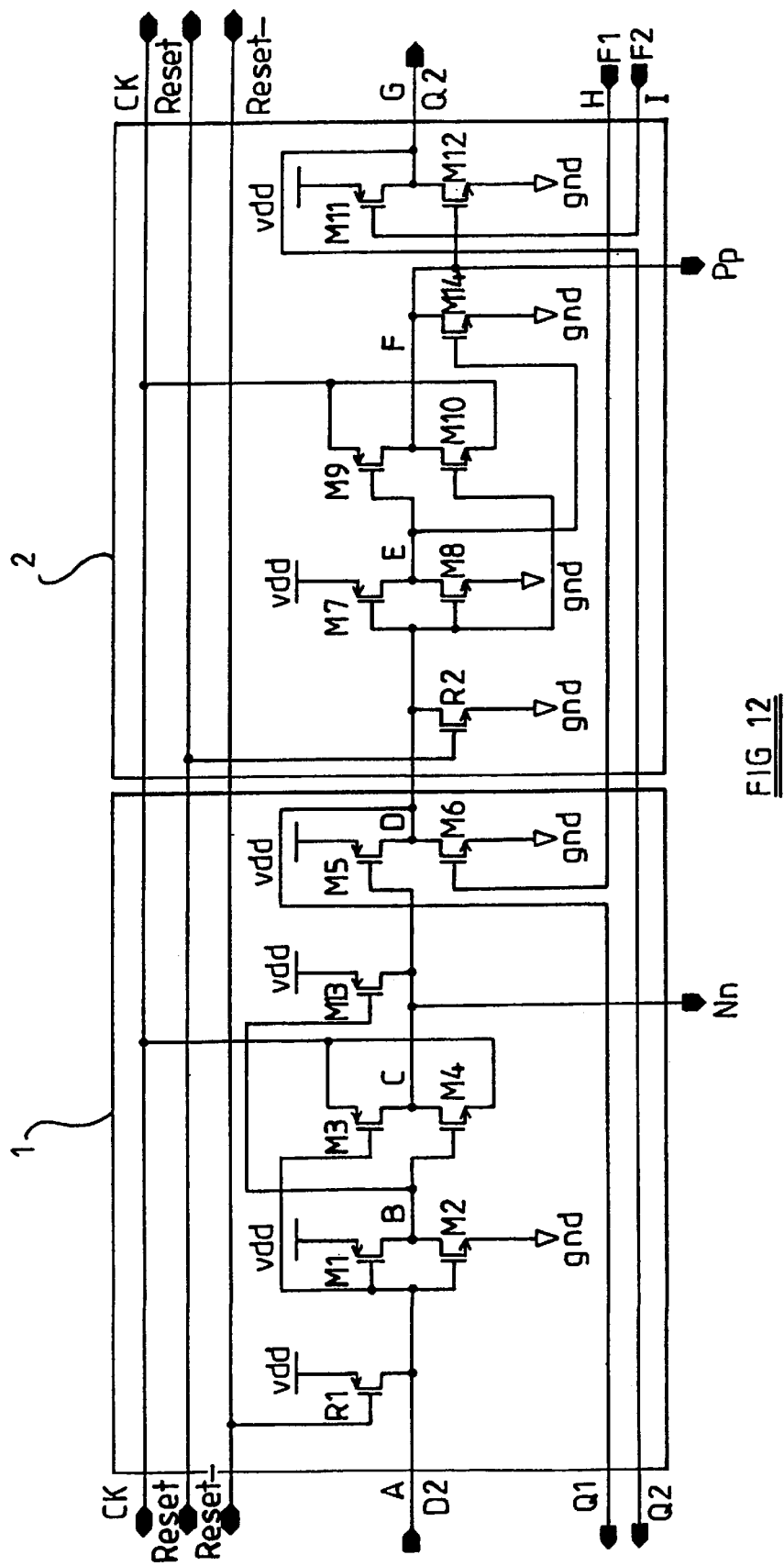
FIG. 12 is a circuit diagram showing the stages illustrated in FIG. 9 provided with a resetting arrangement.

As previously mentioned, careful initialisation by appropriate transistor scaling or using power-on reset techniques are required. However, it may be necessary to force some of the circuit nodes to their correct initial logic states by using an independent reset signal. An arrangement of this type is illustrated in FIG. 12, in which complementary reset signals RESET and RESET– are supplied to the stages 2 and 1, respectively. During initial resetting, the RESET signal is high whereas the RESET– signal is low. The signals turn on a pull-up device in the form of a transistor R1 and a pull-down device in the form of a transistor R2 of opposite conductivity type. The pull-up and pull-down devices are provided at the gate control signal inputs of the stages 1 and 2, respectively. The inputs to the inverters of the stages 1 and 2 are therefore forced to the high and low states, respectively, so that other nodes of the stages are initialised in their correct logic states.

Figure 13:
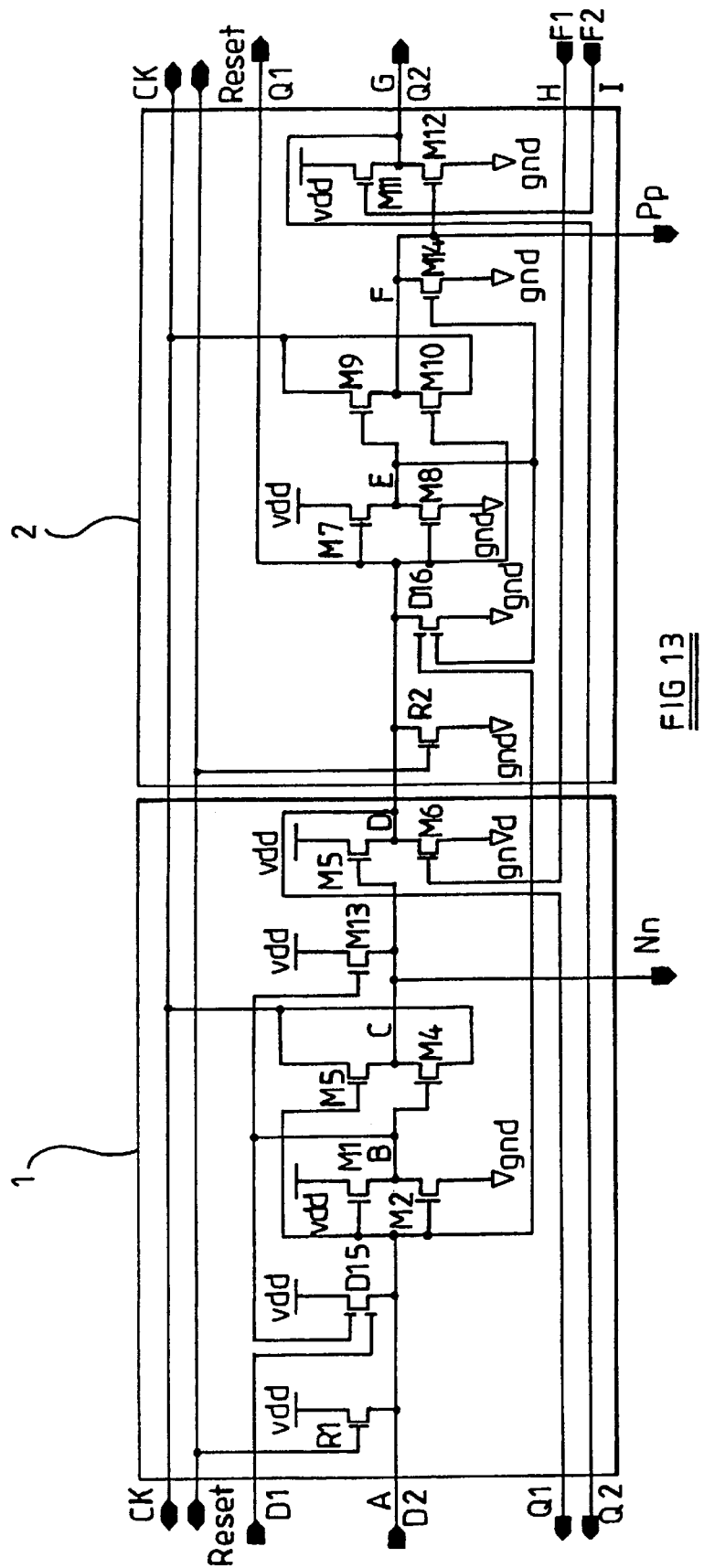
FIG. 13 is a circuit diagram showing the stages illustrated in FIG. 10 provided with another resetting arrangement.

FIG. 13 illustrates a resetting arrangement for the pseudo-static embodiment illustrated in FIG. 10 with a signal resetting line RESET which supplies a high level logic signal during initial resetting. The resetting device R1 and R2 differ from those shown in FIG. 12 in that they comprise transistors of the same conduction type. Thus, the gate control input signals of the stages 1 and 2 are reset to logic high and low states, respectively. Although the pull-up voltage for the stage 1 is reduced by the threshold voltage of the transistor R1, this is sufficient to switch the inverter formed by the transistors M1 and M2 such that feedback via the transistor D15 pulls the signal A to the full logic level. Alternatively, the N-type transistors R1 and R2 maybe replaced by P-type transistors by using an active-low reset signal RESET.

Figure 14:
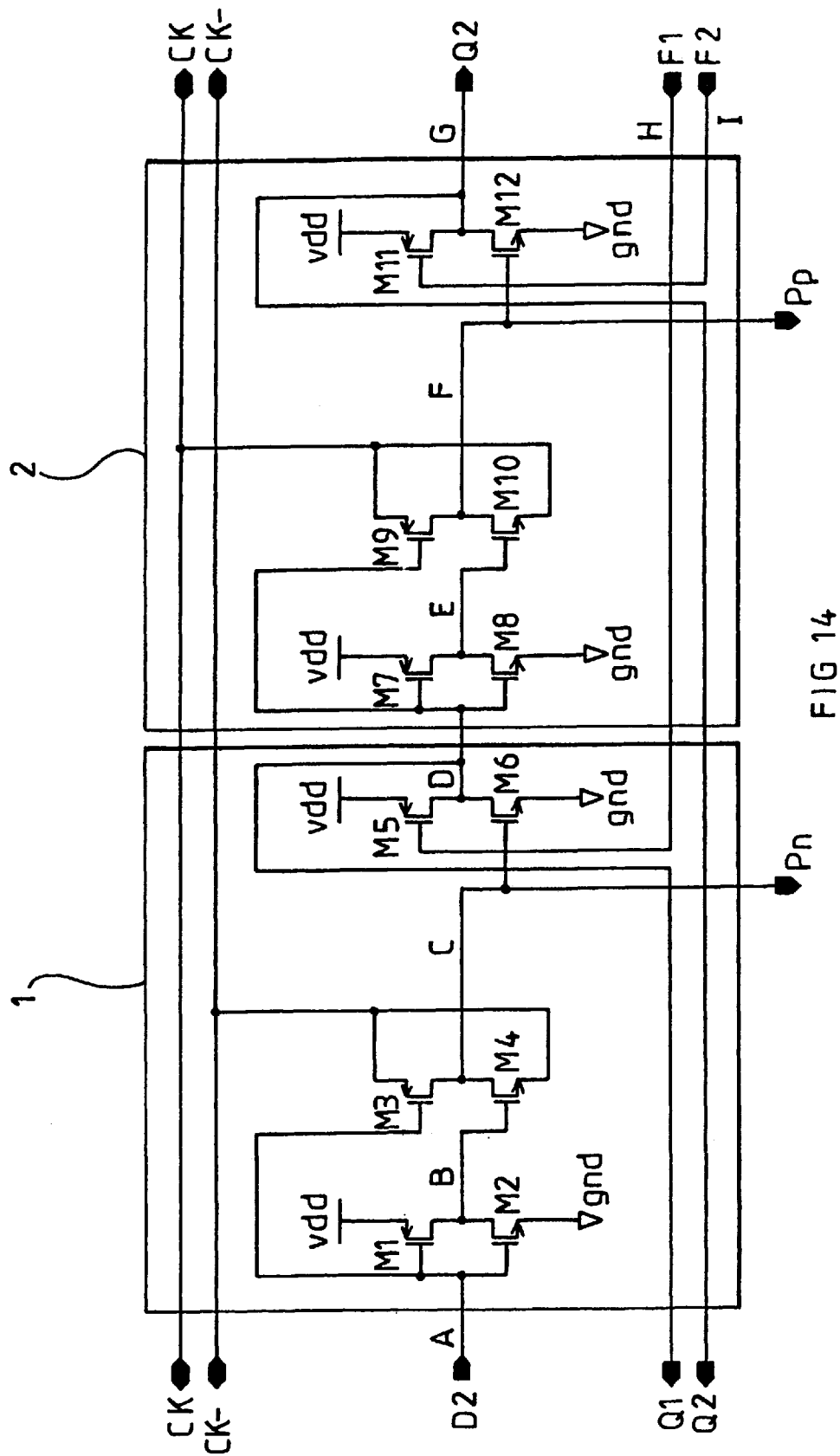
FIG. 14 is a circuit diagram of two stages of a dynamic clock pulse generator constituting an embodiment of the invention.

The clock pulse generator stages 1 and 2 shown in FIG. 14 differ from those shown in FIG. 4 in that they produce positive-going output pulses Pn and Pp derived from two-phase clock signals CK and CK–. The stage 1 differs from that of FIG. 4 in that the input of the transmission gate M3, M4 is connected to receive the complementary clock pulses CK–, the output of the transmission gate is connected to the gate of the transistor M6, and the gate of the transistor M5 is connected to receive the signals H from the input F1. The stage 2 shown in FIG. 14 differs from that shown in FIG. 4 in that the gate of the transistor M9 is connected to the input of the inverter M7, M8 whereas the gate of the transistor M10 is connected to the output of the inverter.

Figure 15:
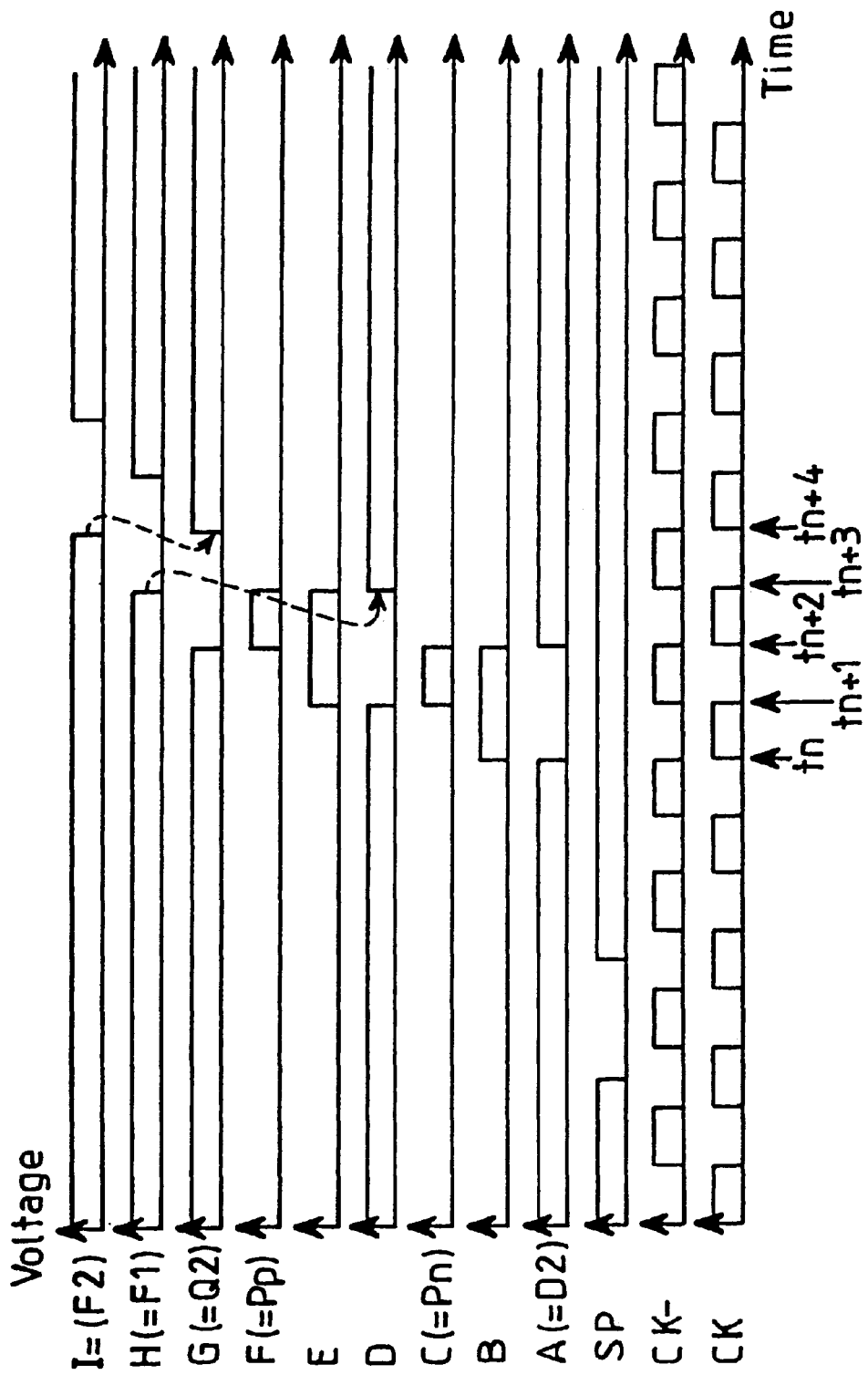
FIG. 15 is a diagram illustrating waveforms occurring in the clock pulse generator whose stages are shown in FIG. 14.

FIG. 15 illustrates the waveforms occurring in a clock pulse generator comprising the stages 1 and 2 shown in FIG. 14 and illustrates the waveforms A to I for the fourth pair of stages. The stages 1 and 2 shown in FIG. 14 operate in substantially the same way as the stages shown in FIG. 4 except for the use of a two-phase clock and the signals C, D, E, and H being inverted or complementary, as illustrated in FIG. 5.

Figure 16:
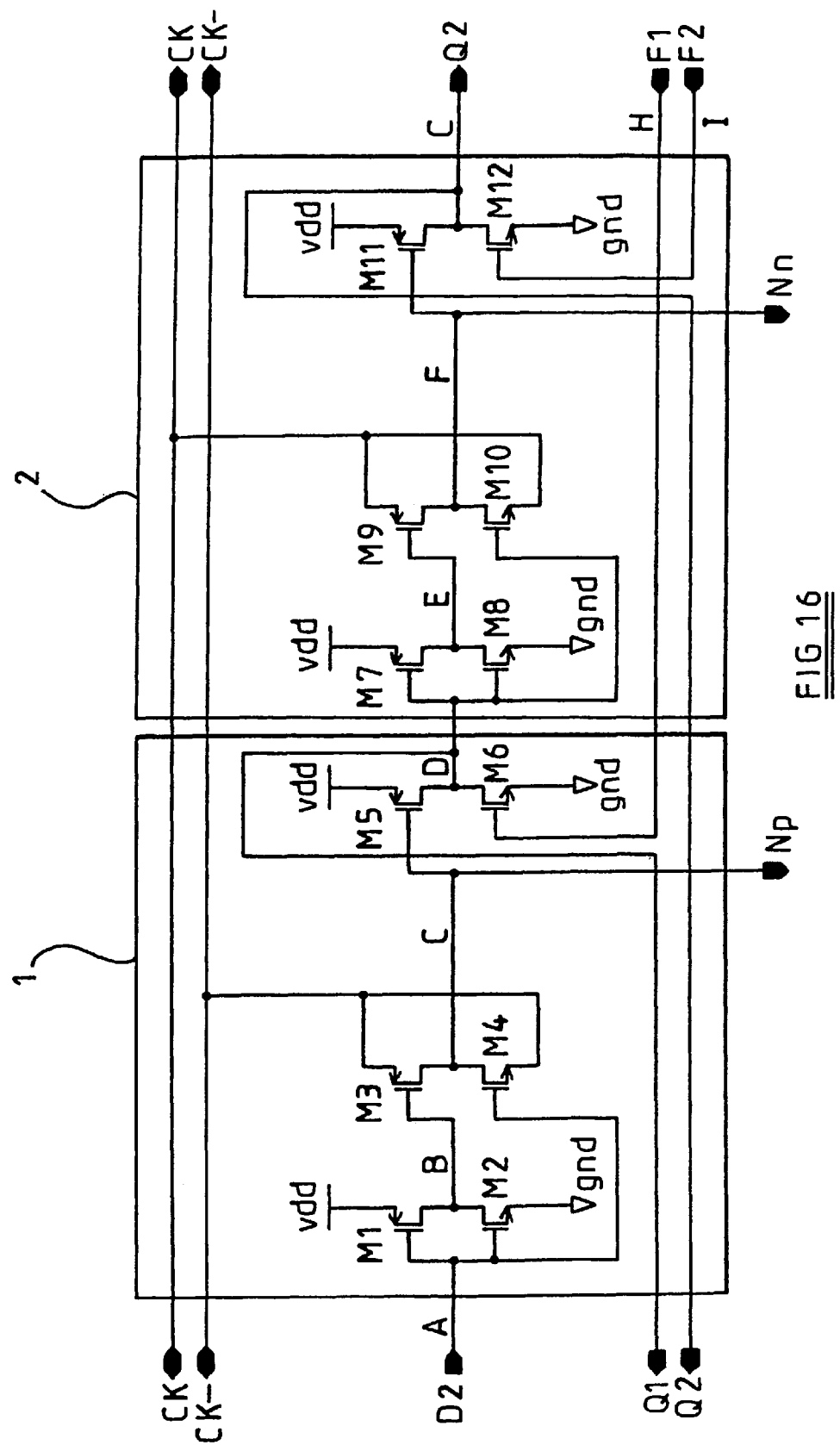
FIG. 16 is a circuit diagram of two stages of complementary type to those shown in FIG. 14.

FIG. 16 illustrates stages 1 and 2 which differ from those shown in FIG. 4 in that negative-going output signals Np and Nn are produced from the two-phase clock signals CK and CK–. The stage 1 shown in FIG. 16 differs form that shown in FIG. 14 in that the gates of the transistors M3 and M4 are connected to the output and input respectively, of the inverter M1 and M2, the output of the transmission gate is connected to the gate of the transistor M5 and the gate of the transistor M6 is connected to receive the signals H from the input F1. The stage 2 shown in FIG. 16 differs from that shown in FIG. 14 in that the gates of the transistors M9 and M10 are connected to the output and input, respectively, of the inverter M7 and M8, the output of the transmission gate is connected to the gate of the transistor M11 and the gate of the transistor M12 is connected to receive the signals I from the input F2. Operation of the stages 1 and 2 is substantially identical to that of the stages shown in FIG. 14 except that the signals A to I are all complementary to those occurring in the stages shown in FIG. 14 and illustrated in FIG. 15.

Figure 17:
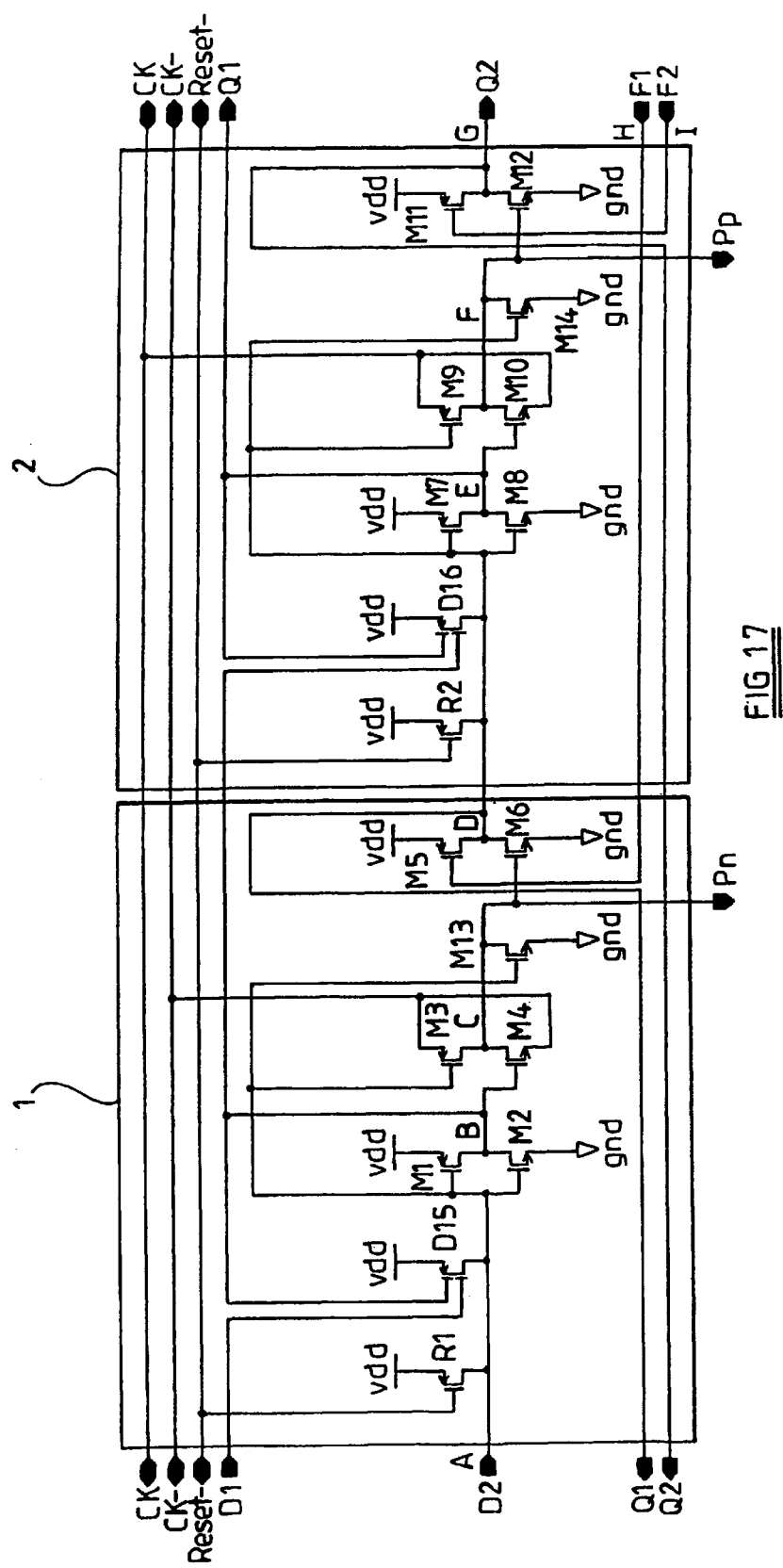
FIG. 17 is a circuit diagram of two stages of a pseudo-static clock pulse generator constituting an embodiment of the invention and provided with a resetting arrangement.

FIG. 17 illustrates stages 1 and 2 which differ from those illustrated in FIG. 14 in that they are pseudo-static. Also, a resetting arrangement of the type described hereinbefore is provided. As described hereinbefore with reference to FIG. 10, additional transistors M13, M14, D15 and D16 are used to make the stages 1 and 2 pseudo-static. These arrangements differ from those shown in FIG. 10 in that the transistor M13 is connected between the output of the transmission gate M3, M4 and the supply line gnd; the gate of the transistor M14 is connected to the input of the inverter M7, M8; one of the gates of the dual gate transistor D15 is connected to the output of the inverter M7, M8 of the preceding stage; the dual gate transistor D16 is connected between the input of the inverter M7, M8 and the supply line vdd; and one of the gates of the transistor D16 is connected to the output of the inverter M1, M2.

The resetting arrangement comprises pull-up transistors R1 and R2, whose gates are connected to a complementary reset line RESET– which is "active-low". The transistors R1 and R2 are connected between the supply line VDD and inputs of the respective inverters of the stages 1 and 2.

Figure 18:
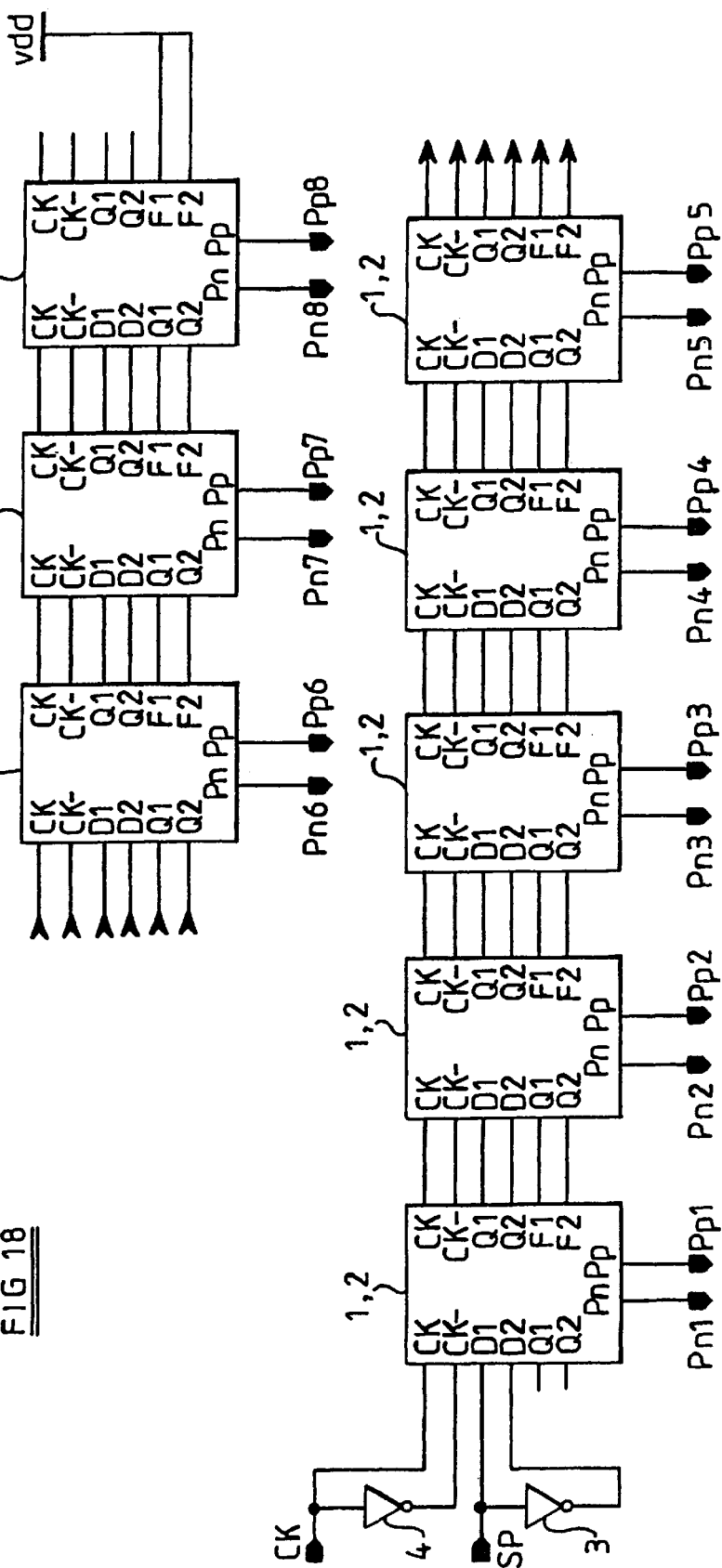
FIG. 18 is a block diagram of the clock pulse generator whose stages are illustrated in FIG. 17 but omitting the resetting arrangement.

FIG. 18 the illustrates a complete clock pulse generator formed by eight pairs of stages 1, 2 of the type shown in FIG. 17 but with the reset line RESET– not shown. As illustrated in FIG. 11, the input D2 is connected to the output of an inverter 3 whose input receives the start pulse SP. FIG. 18 the also shows the complementary or inverted clock signals CK– being derived from the output of an inverter 4 whose input receives the clock signals CK.

In the embodiment illustrated in FIG. 17, the outputs of the transmission gates of the stages 1 and 2 drive the transistors M6 and M12 which are of the same conductivity type, namely N-type. Because no P-type transistors are driven by the clock pulse signals CK and CK–, the clock pulse voltage does not have the swing between the supply lines gnd and vdd. If the supply line gnd is assumed to be at zero volts, then the clock pulse signals are required to swing between this and a voltage greater than the threshold voltage Vtn of the N-type devices M6 and M12. For example, for typical threshold voltages Vtn of 0.7 volts, the clock pulse generator can operate with a clock signal amplitude of 3.3 volts and a supply voltage of 5 volts. This may be advantageous if the required outputs of the clock pulse generator are not the signals Pn and Pp, which have the amplitude of the clock signals, but are the clock gate control signals D and G, which switch between zero volts and vdd.

Figure 19:
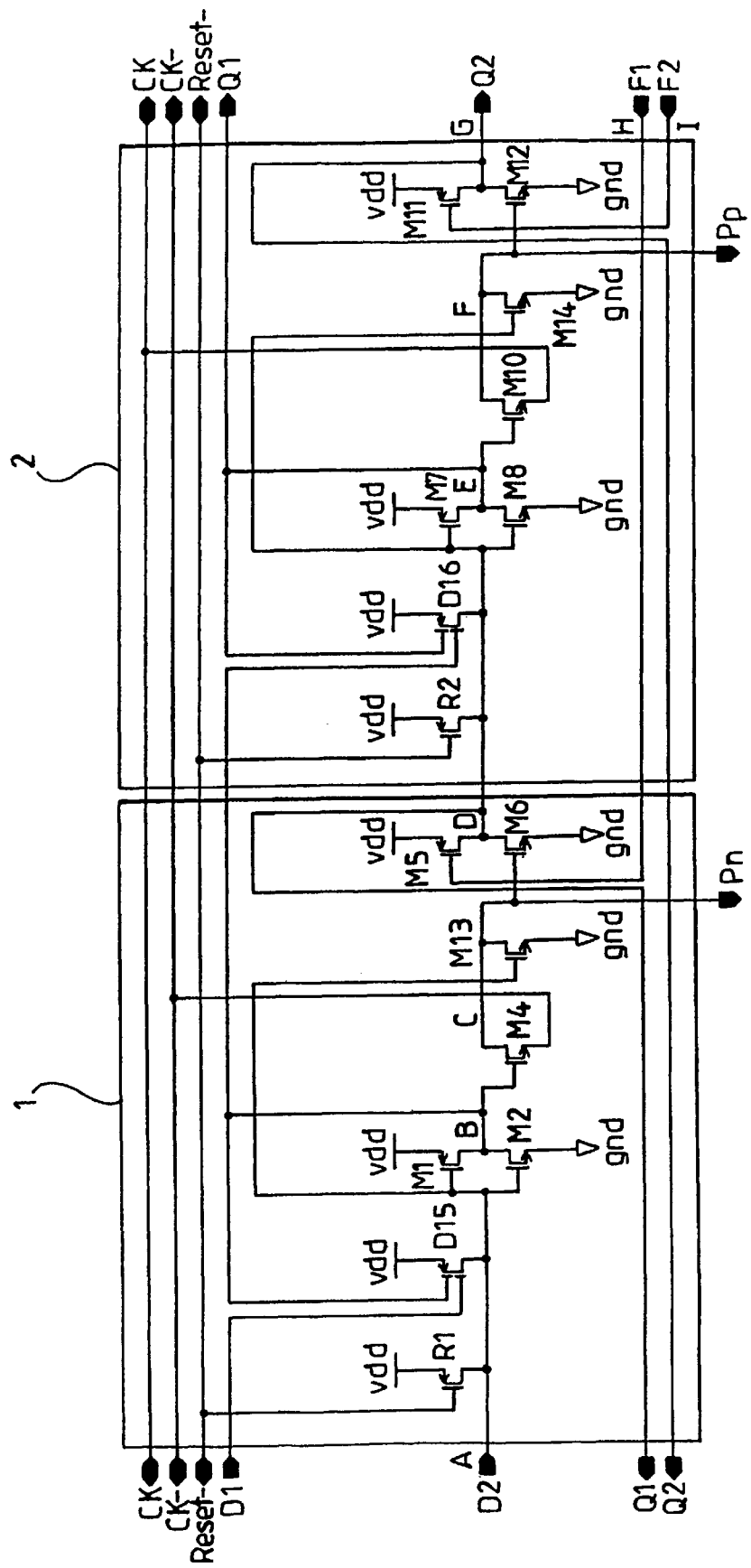
FIG. 19 is a circuit diagram of two stages of the type shown in FIG. 18 with a modified form of pass gates.

The clock pulse generator stages 1 and 2 shown in FIG. 19 take advantage of this and are suitable for lower voltage operation than the stages shown in FIG. 17. The difference between the stages 1 and 2 shown in FIG. 19 and those shown in FIG. 17 are that the transmission gates are replaced by single N-type transistors M4 and M10 whose gates are connected to the respective inverter outputs. The transistors M4 and M10 act as pass gates which are driven by the full supply voltage from the inverters but are only required to pass the lower voltage clock signals CK and CK–. This can be achieved with sufficient speed provided the clock pulse voltage is less than (vdd-vtn).

Figure 20:
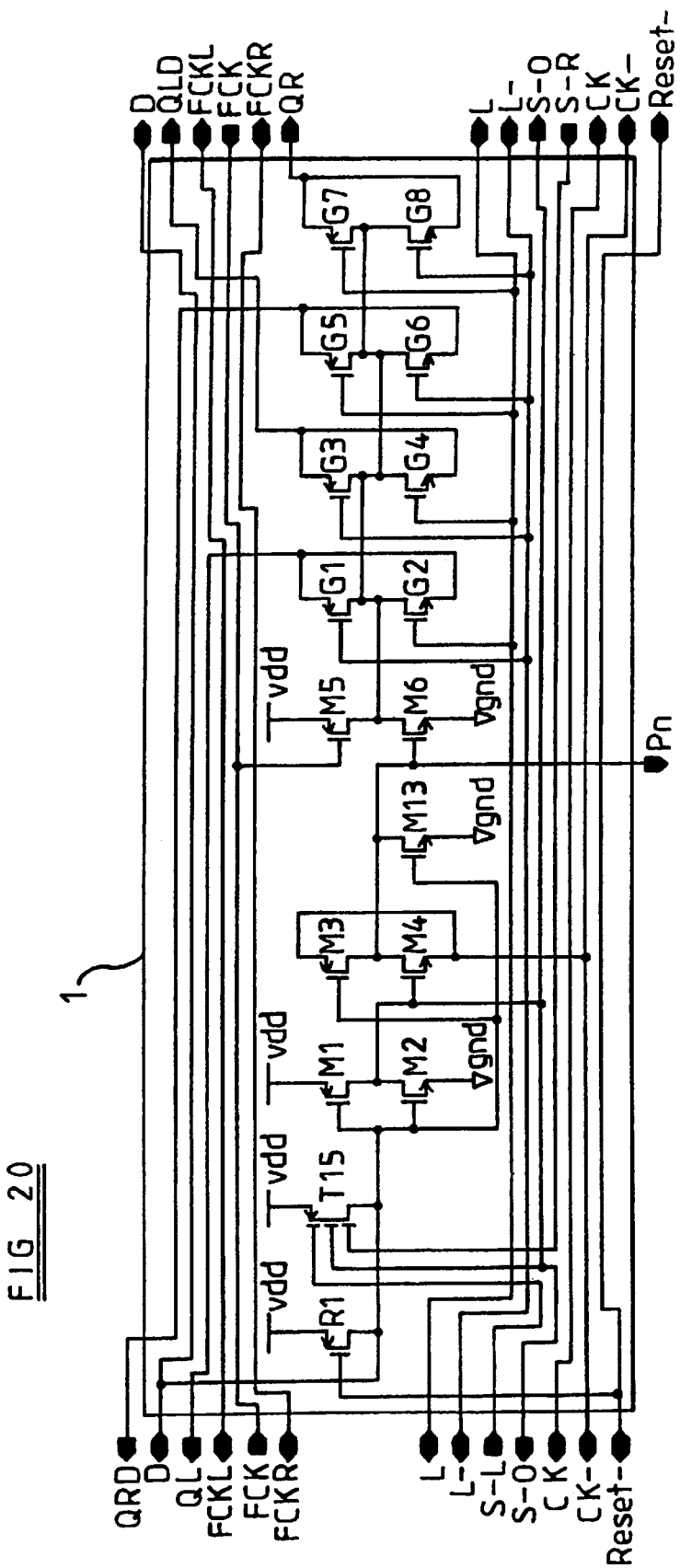
FIGS. 20 and 21 are a circuit diagram of two stages of the type shown in FIG. 17 modified for operation in either direction.
Figure 21:
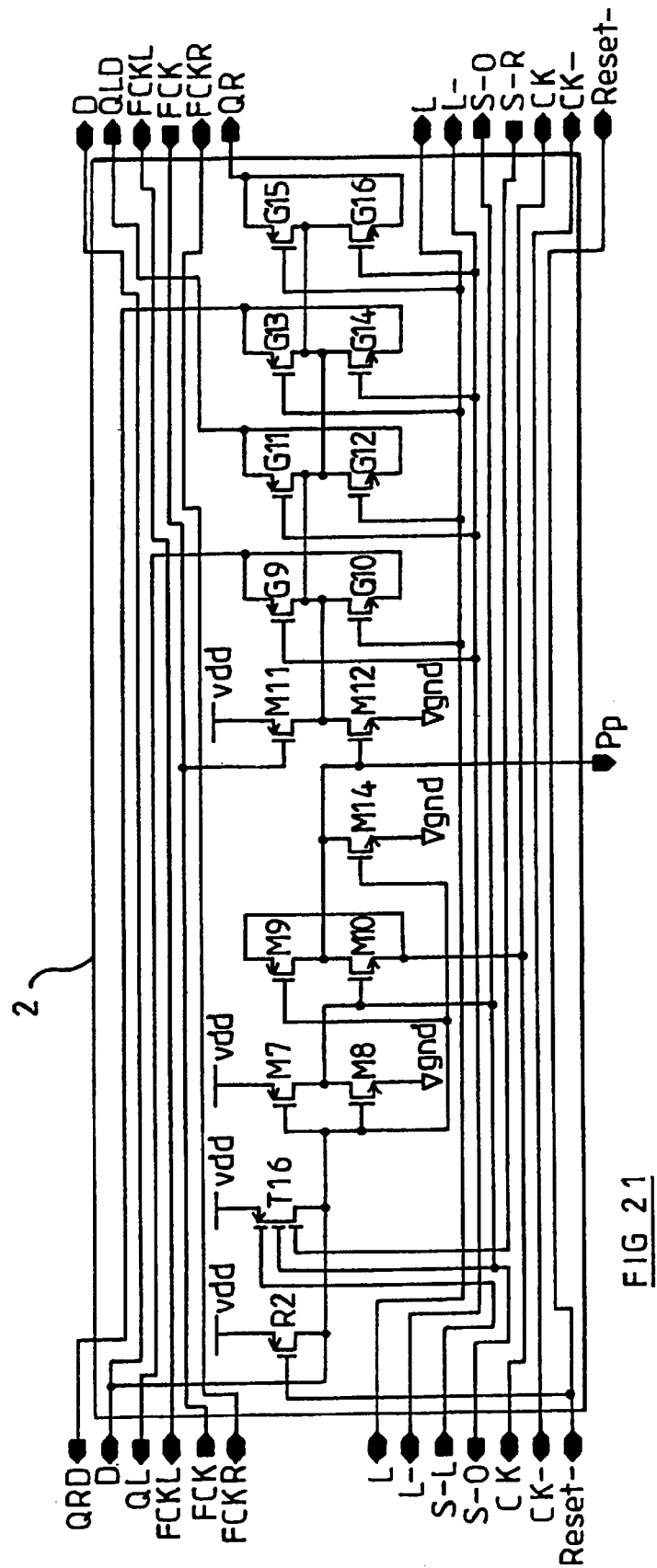

The stages 1 and 2 shown in FIGS. 20 and 21, respectively, differ from those shown in FIG. 17 in that they are arranged tow to work in both directions. In other words, depending on direction control signals L and L–, the clock pulse generator may act as a shift register transferring the single logic high level from left to right or from right to left. This is achieved by the addition of pass logic in the form of transmission gates and by replacing the dual gate transistors D15 and D16 with triple gate transistors T15 and T16.

The stage 1 comprises transmissions gate formed by pair of transistors G1 to G8. The gates of the transistor pairs are connected to the direction control lines L and L–. The input of the transmission gates are connected together to receive the gate controls signal form the control signal generating circuit M5, M6. The output of the transmission gate G1, G2 is connected to a feedback output QL for operation from right to left. The output of the transmission gate G3, G4 is connected to an output clock gate control signal line QLD for operation from left to right. The output of the transmission gate G5, G6 is connected to an output clock gate signal signal line QRD for operation from right to left. The output of the transmission gate G7, G8 is connected to a feedback output QR for operation from left to right. The gate of the transistor M5 is connected to a feedback input FCK for operation in either direction. The output of the inverter M1, M2 is connected to a static latch output S-O and to one of the gates of the transistor T15. The other gates of the transistor T15 are connected to a static latch input S-L from the left and to a static latch input S-R form the right.

The stage 2 likewise comprises transmission gates formed by transistors G9 to G16 which are controlled by the direction control lines L and L-. The inputs of the transmission gates are connected to the control signal generating circuit M11, M12. The output of the transmission gate G9, G10 is connected to the feedback output QL for operation from right to left. The output of the transmission gate G11, G12 is connected to output clock gate control signal line QLD for operation from left to right. The output of the transmission gate G13, G14 is connected to the output clock gate control signal line QRD for operation from right to left. The output of the transmission gate G15, G16 is connected to the feedback output QR for operation from left to right.

The output of the inverter M7, M8 is connected to the static latch output S-O and to one of the gates of the transistor T16. The other gates of the transistor T16 are connected to the static latch input S-L from the left and to the static latch input S-R from the right.

Line D carries input clock gata control signals form the left or right and line FCK carries feedback input signals from the left or right in accordance with the current direction of operation. Signal line FCKR supplies feedback signals from the (n−1)th stage to the (n+1)th stage when operation is from right to left. Signals line FCKL carries feedback signals from the (n+1)th stage to the (n−1)th stage when operation is from left to right.

When the direction control signal L is high, operation is from left to right. The transmission gates G1, G2 and G3, G4 are conductive whereas the transmission gate G5, G6, and G7, G8 are in their high impedance state. Thus, the gate control signal is passed to the right via the transmission gate G3, G4 and the line OLD and the feedback signal is passed to the left via transmission gate G1, G2 and the line QL. Conversely, when the direction control signal L is low, operation is from right to left. The transmission gates are in their opposite states so that the gate control signal is passed to the left via the gate G5, G6 and the line QRD and the feedback is passed to the right via the transmission gate G7, G8 and the line QR.

The triple gate transistors T15 and T16 ensure that the latches operating around the inverters M1, M2 and M7, M8 are unlocked by the signals S-L or S-R whenever the stages on either side are activated. This allows each stage to operate in a bi-directional fashion because each can anticipate a clock gate control signal from the left or right and respond appropriately.

Figure 22:
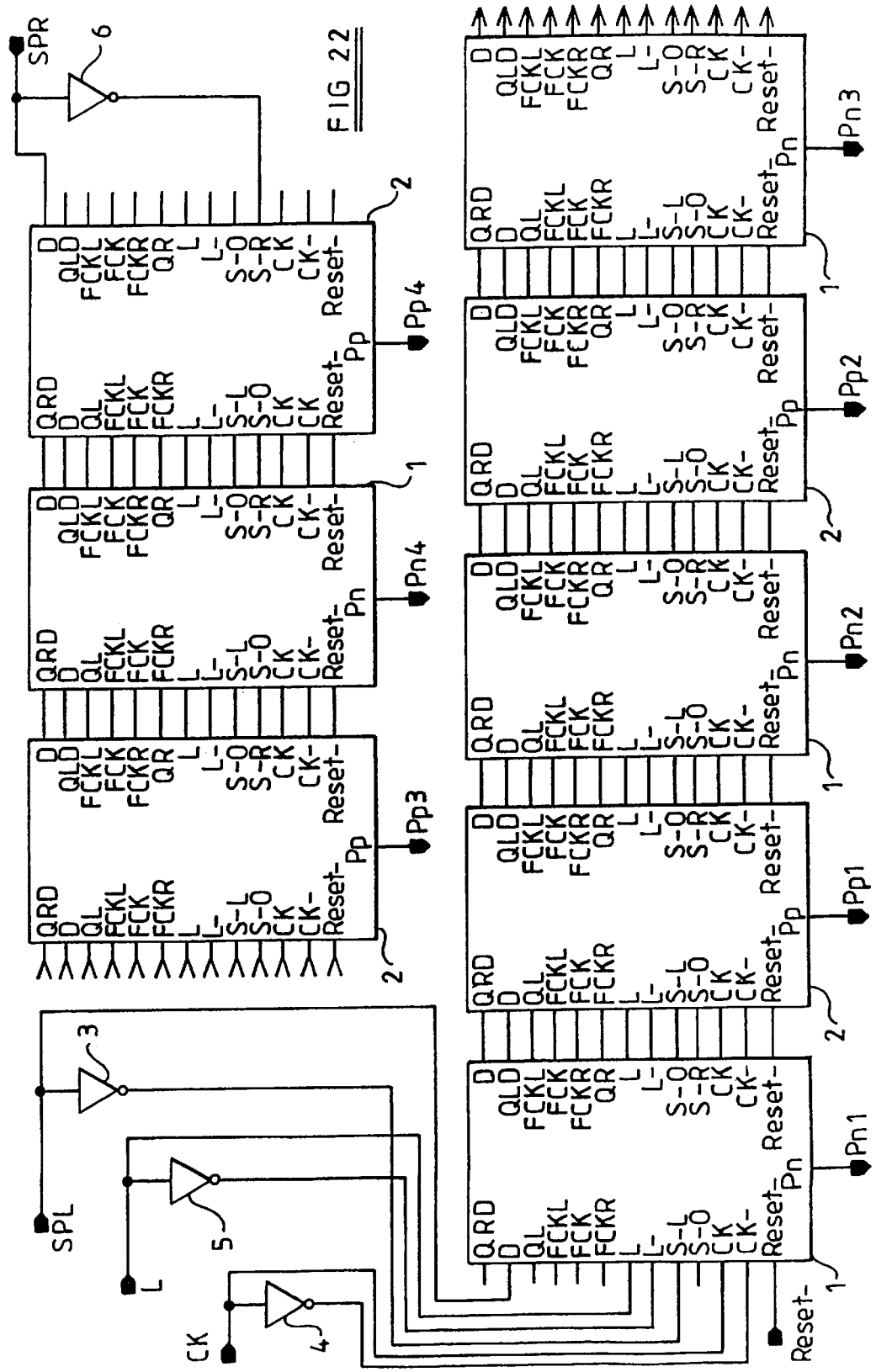
FIG. 22 is a block diagram of the clock pulse generator whose stages are illustrated in FIGS. 20 and 21.

FIG. 22 illustrates a clock pulse generator formed by four pairs of stages 1 and 2 of the type shown in FIGS. 21 and 22. In addition to the inverters 3 and 4 described hereinbefore, an inserter 5 is provided to generate the complementary direction control signal L-from the direction control signal L. Also, left or right start pulses SPL or SPR may be provided depending on the direction of operation and an inverter 6 is provided for operation from the right so as to generate the appropriate static latch input S-R.

Figure 23:
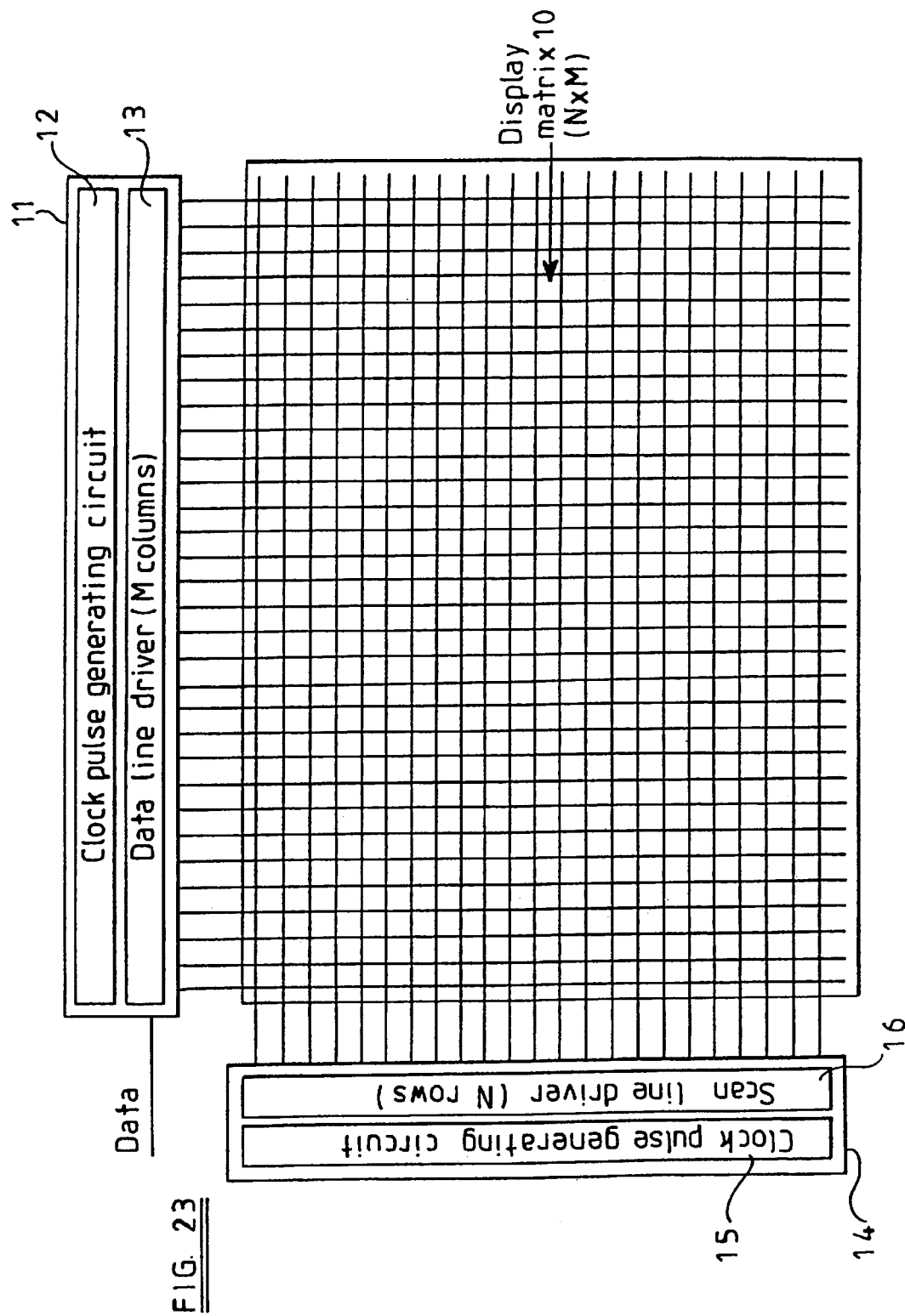
FIG. 23 is a block schematic diagram of a spatial light modulator constituting an embodiment of the invention.

FIG. 23 illustrates a display comprising a display matrix 10 of N rows by M columns of picture elements (pixels), for instance in the form of a spatial light modulator comprising a liquid crystal device. The display further comprises an address signal generator 11 comprising a clock pulse generator circuit 12 and a set of data line drivers 13. The clock pulse generating circuit 12 comprises a generator of any of the types described hereinbefore and illustrated in FIGS. 4 to 22. A scan signal generator 14 supplies scan signals to the rows of pixels and comprises a clock pulse generating circuit 15 and a set of scan line drivers 16. The clock pulse generating circuit 15 comprises a generator of any of the types described hereinbefore and illustrated in FIGS. 4 to 22. The clock pulse generating circuits generate clock pulses at pixel data rate for the circuit 12 and at line data rate for the circuit 15.

What is claimed is:

1. A clock pulse generator comprising a clock input and N stages, when N is greater than three, each ith one of the stages comprising a pass gate arranged to be controlled by a control signal from the (i−1)th stage for passing a clock pulse from the clock input to an output of the pass gate and a control signal generating circuit responsive to the output of the pass gate for supplying a control signal to the (i+1)th stage, the control signal generating circuit being arranged to be inhibited form supplying further control signals in response to a control signals from the (i+2)th stage, where 1<i<(N−1), wherein the controls signal generating circuit of each ith stage comprises first and second metal-oxide-silicon field effect transistors of opposite conductivity types connected in series between first and second power supply inputs, the gate of the first transistor being connected to the output of the pass gate and the gate of the second transistor being connected to the control signal generating circuit of the (i+2)th stage.

2. A generator as claimed in claim 1, in which each ith stage comprises a switching arrangement for selectively causing the pass gate to be controlled by a control signal form the (i+1)th stage and the control signal generating circuit to be inhibited in response to a control signal form the (i−2)th stage.

3. A generator a claimed in claim 2, in which the switching arrangement comprises a plurality of further pass gate connected to the output of the control signal generating circuit and having control inputs for receiving direction control signals.

4. A generator as claimed in claim 1, in which at least one of the pass gate outputs constitute outputs of the clock pulse generator.

5. A generator as claimed in claim 1, in which at least one of the control signals or the complements thereof constitute output signals of the clock pulse generator.

6. A generator as claimed in claim 1, in which the pass gates have inputs connected to the clock input.

7. A generator as claimed in claim 1, in which each ith stage comprises an inverter having an input connected to receive the control signal for the pass gate and an output connected to the pass gate.

8. A generator as claimed in claim 1, in which each of the pass gates is a transmission gate comprising third and fourth metal-oxide-silicon field effect transistors of opposite conductivity types whose source-drain paths are connected in antiparallel.

9. A generator as cliamed in claim 1, in which each ith stage comprises an inverter having an input connected to receive the control signal for the pass gate and an output connected to the pass gate;

in which each of the pass gates is a transmission gate comprising third and fourth metal-oxide-silicon field effect transistors of opposite conductivity types whose source-drain paths are connected in antiparallel; and in which the gate of the fourth transistor is connected to the output of the inverter and the gate of the third transistor is connected to the input of the inverter.

10. A generator as claimed in claim 1, in which the pass gate of each ith stage comprises a fifth metal-oxide-silicon field effect transistor of the same conductivity type as the first transistor.

11. A generator as claimed in claim 1, in which the clock input is a single phase clock input.

12. A generator as claimed in claim 11, in which the clock pulses passed by the pass gates of consecutive stages are of opposite polarity.

13. A generator as claimed in claim 12, in which each of the pass gates is transmission gate comprising third and fourth metal-oxide-silicon field effect transistors of opposite conductivity types whose source-drain paths are connected in antiparallel; and in which the third transistors of the transmission gates of consecutive stages are of opposite conductivity types.

14. A generator as claimed in claim 12, in which each ith stage comprises an inverter having an input connected to receive the control signal for the pass gate and an output connected to the pass gate;

in which each of the pass gates is a transmission gate comprising third and fourth metal-oxide-silicon field effect transistors of opposite conductivity types whose course-drain paths are connected in antiparallel;

in which the gate of the fourth transistor is connected to the output of the inverter and the gate of the third transistor is connected to the input of the inverter; and in which the third transistors of the transmission gates of consecutive stages are of opposite conductivity types.

15. A generator as claimed in claim 1, in which the first transistors of consecutive stages are of opposite conductivity types.

16. A generator as claimed in claim 1, in which the clock input is a two phase clock input.

17. A generator as claimed in claim 16, in which the pass gates have inputs connected to the clock input; and in which the pass gate inputs of consecutive stages are connected to different clock input phases.

18. A generator as claimed in claim 17, in which the clock pulses passed by the pass gates of the stages are of the same polarity.

19. A generator as claimed in claim 18, in which each of the pass gates is a transmission gate comprising third and fourth metal-oxide-silicon field effect transistors of opposite conductivity types whose source-drain paths are connected in antiparallel; and in which the third transistors of the stages are of the same conductivity type.

20. A generator as claimed in claim 18, in which each ith stage comprises an inverter having an input connected to receive the control signal for the pass gate and an output connected to the pass gate;

in which each of the pass gates is a transmission gate comprising third and fourth metal-oxide-silicon field effect transistors of opposite conductivity types whose source-drain paths are connected in antiparallel;

in which the gate of the fourth transistor is connected to the output of the inverter and the gate of the third transistor is connected to the input of the inverter; and in which the third transistors of the stages are of the same conductivity type.

21. A generator as claimed in claim 1, in which the first transistors of the stages are of the same conductivity type.

22. A generator as claimed in claim 1, in which the pass gate output of each stage is provided with a pull-up or pull-down transistor.

23. A generator as claimed in claim 22, in which each ith stage comprises an inverter having an input connected to receive the control signal for the pass gate and an output connected to the pass gate; and in which each pull-up or pull-down transistor has a control electrode connected to the input or output of the inverter.

24. A generator as claimed in claim 1, in which each of the stages has a control signal input for receiving the control signal for the pass gate, each control signal input being provided with a pull-up or pull-down arrangement.

25. A generator as claimed in claim 24, in which each ith stage comprises an inverter having an input connected to receive the control signal for the pass gate and an output connected to the pass gate; and in which each pull-up or pull-down arrangement comprises a transistor arrangement having a first contorl electrode connected to the output of the inverter and a second control electrode connected to the control signal input of the preceding stage or the output of the inverter of the preceding stage.

26. A generator as claimed in claim 1, in which each of the stages has a resetting circuit for resetting the stage in response to a reset signal.

27. A generator as claimed in claim 11, in which each of the stages has a resetting circuit for resetting the stage in response to a reset signal; and in which each of the stages has a control signal input for receiving the control signal for the pass gate, the resetting circuits of consecutive stages being arranged to reset the logic states of the signals at the control signal inputs to opposite states.

28. A generator as claimed in claim 27, in which each of the resetting circuits comprises a sixth transistor.

29. A generator as claimed in claim 28, in which the sixth transistors of consecutive stages are of opposite conductivity types and have control electrodes connected to reset inputs of opposite polarity.

30. A generator as claimed in claim 28, in which the sixth transistors are of the same conductivity type and have control electrodes connected to a common reset input.

31. A generator as claimed in claim 16, in which each of the stages has a resetting circuit for resetting the stage in response to a reset signal; and in which each of the stages has a controls signal input for receiving the controls signal for the pass gate, the resetting circuits being arranged to reset the logic states of the signals at the control signal inputs of the stages to the same state.

32. A generator as claimed in claim 31, in which each of the resetting cirucits comprises a sixth transistor.

33. A generator as claimed in claim 32, in which the sixth transistors are of the same conductivity type and have control inputs connected to a common reset input.

34. A generator as claimed in claim 1, comprising a CMOS integrated circuit.

35. A spatial light modulator comprising a clock pulse generator as claimed in claim 1.

36. A modulator as claimed in claim 35, comprising a liquid crystal device.

37. A display comprising a modulator as claimed in claim 35.

38. A display comprising a modulator as claimed in claim 36.

39. A generator as claimed in claim 15, in which each of the stages has a resetting circuit for resetting the stage in response to a reset signal; and in which each of the stages has a control signal input for receiving the control signal for the pass gate, the resetting circuits of consecutive stages being arranged to reset the logic states of the signals at the control signal input to opposite states.

40. A generator as claimed in claim 21, in which each of the stages has a resetting circuit for resetting the stage in response to a reset signal; and in which each of the stages has a control signal input for receiving the control signal for the pass gate, the resetting circuits being arranged to reset the logic states of the signals at the control signal inputs of the stages to the same state.

* * * * *